United States Patent
Yamazaki

(10) Patent No.: US 7,400,087 B2
(45) Date of Patent: *Jul. 15, 2008

(54) LIGHT-EMITTING DEVICE HAVING TRIPLET AND SINGLET COMPOUND IN LIGHT-EMITTING LAYERS

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 155 days.

This patent is subject to a terminal disclaimer.

(21) Appl. No.: 11/105,414

(22) Filed: Apr. 14, 2005

(65) Prior Publication Data

US 2005/0233170 A1  Oct. 20, 2005

Related U.S. Application Data

(63) Continuation of application No. 09/871,805, filed on Jun. 4, 2001.

(30) Foreign Application Priority Data

Jun. 5, 2000 (JP) .............................. 2000-168325

(51) Int. Cl.
*H01L 51/00* (2006.01)
(52) U.S. Cl. .................... 313/504; 313/506; 428/690; 428/917
(58) Field of Classification Search ......... 313/504, 313/506; 428/690, 917
See application file for complete search history.

(56) References Cited

U.S. PATENT DOCUMENTS 4,974,942 A  12/1990  Gross et al.
5,216,331 A  6/1993  Hosokawa et al.
5,294,810 A  3/1994  Egusa et al.
5,457,565 A  10/1995  Namiki et al.
5,485,055 A  1/1996  Keyser
5,703,436 A  12/1997  Forrest et al.
5,742,129 A  4/1998  Nagayama et al.
5,756,224 A  5/1998  Börner et al.
5,928,802 A  7/1999  Shi et al.

(Continued)

FOREIGN PATENT DOCUMENTS

EP  0 390 551  10/1990

(Continued)

OTHER PUBLICATIONS

M. A. Baldo et al., "Highly Efficient Phosphorescent Emission from Organic Electroluminescent Devices", Nature vol. 395, Sep. 10, 1998, pp. 151-154.

(Continued)

*Primary Examiner*—Karabi Guharay
(74) *Attorney, Agent, or Firm*—Fish & Richardson P.C.

(57) ABSTRACT

There is provided a light emitting device which enables a color display with good color balance. A triplet compound is used for a light emitting layer of an EL element that emits red color, and a singlet compound is used for a light emitting layer of an EL element that emits green color and a light emitting layer of an EL element that emits blue color. Thus, an operation voltage of the EL element emitting red color may be made the same as the EL element emitting green color and the EL element emitting blue color. Accordingly, the color display with good color balance can be realized.

80 Claims, 14 Drawing Sheets

U.S. PATENT DOCUMENTS

| | | | |
|---|---|---|---|
| 5,932,892 | A | 8/1999 | Hseuh et al. |
| 5,990,629 | A | 11/1999 | Yamada et al. |
| 6,046,547 | A | 4/2000 | Nishio et al. |
| 6,072,278 | A | 6/2000 | Keyser et al. |
| 6,097,147 | A | 8/2000 | Baldo et al. |
| 6,133,693 | A | 10/2000 | Keyser |
| 6,160,272 | A | 12/2000 | Arai et al. |
| 6,175,345 | B1 | 1/2001 | Kuribayashi et al. |
| 6,191,764 | B1 | 2/2001 | Kono et al. |
| 6,194,837 | B1 | 2/2001 | Ozawa |
| 6,204,610 | B1 | 3/2001 | Komiya |
| 6,303,238 | B1 | 10/2001 | Thompson et al. |
| 6,310,360 | B1 | 10/2001 | Forrest et al. |
| 6,358,633 | B1 | 3/2002 | Sano et al. |
| 6,359,606 | B1 | 3/2002 | Yudasaka |
| 6,420,834 | B2 | 7/2002 | Yamazaki et al. |
| 6,433,486 | B1 | 8/2002 | Yokoyama |
| 6,559,594 | B2 | 5/2003 | Fukunaga et al. |
| 6,608,449 | B2 | 8/2003 | Fukunaga |
| 6,641,933 | B1 | 11/2003 | Yamazaki et al. |
| 6,689,492 | B1 | 2/2004 | Yamazaki et al. |
| 6,730,966 | B2 | 5/2004 | Koyama |
| 6,750,608 | B2 * | 6/2004 | Matsuura et al. ............ 313/504 |
| 6,780,687 | B2 | 8/2004 | Nakajima et al. |
| 6,872,604 | B2 | 3/2005 | Yamazaki et al. |
| 6,878,470 | B2 * | 4/2005 | Kawamura et al. .......... 428/690 |
| 6,910,933 | B1 * | 6/2005 | Matsuo et al. ................ 445/24 |
| 2001/0020922 | A1 | 9/2001 | Yamazaki et al. |
| 2001/0045565 | A1 | 11/2001 | Yamazaki |
| 2001/0049197 | A1 | 12/2001 | Yamazaki et al. |
| 2001/0051207 | A1 | 12/2001 | Yamagata et al. |
| 2002/0024051 | A1 | 2/2002 | Yamazaki et al. |
| 2002/0050786 | A1 | 5/2002 | Yamazaki et al. |
| 2004/0065902 | A1 | 4/2004 | Yamazaki et al. |
| 2005/0140280 | A1 | 6/2005 | Yamazaki et al. |
| 2005/0197031 | A1 | 9/2005 | Yamazaki et al. |

FOREIGN PATENT DOCUMENTS

| | | |
|---|---|---|
| GB | 2 344 346 | 6/2000 |
| JP | 02-261889 | 10/1990 |
| JP | 03-115486 | 5/1991 |
| JP | 03-230583 | 10/1991 |
| JP | 03-230584 | 10/1991 |
| JP | 07-094278 | 4/1995 |
| JP | 10-039791 | 2/1998 |
| JP | 10-148853 | 6/1998 |
| JP | 10-214060 | 8/1998 |
| JP | 10-255983 | 9/1998 |
| JP | 11-111457 | 4/1999 |
| JP | 11-338786 | 12/1999 |
| JP | 2000-089691 | 3/2000 |
| JP | 2000-111721 | 4/2000 |
| JP | 2000-148087 | 5/2000 |
| JP | 2000-150152 | 5/2000 |
| WO | WO98/33165 | 7/1998 |
| WO | WO1998/033165 | 7/1998 |

OTHER PUBLICATIONS

M. A. Baldo et al., "Very High-Efficiency Green Organic Light-Emitting Devices Based on Electrophosphorescence", Applied Physics Letters vol. 75, No. 1, Jul. 5, 1999, pp. 4-6.

O'Brien et al., "Improved Energy Transfer In Electrophosphorescent Devices", Jan. 18, 1999, Applied Physics Letters, vol. 74, No. 3.

Tsutsui et al., "Electroluminescence in Organic Thin Films", Photochemical Processes in Organized Molecular Systems, 1991, pp. 437-450.

Tsutsui et al., "High Quantum Efficiency in Organic Light-Emitting Devices with Irdium-Complex as a Triplet Emissive Center", Japanese Journal of Applied Physics vol. 38, Part 12B, Dec. 15, 1999, pp. L1502-L1504.

Nishi et al., "High Efficiency TFT-OLED Display With Iridium-Complex as Triplet Emissive Center," Proceedings of the 10th International Workshop on Inorganic and Organic Electroluminescence (EL '00), pp. 353-356, Dec. 2000.

Mizukami et al., "6-bit Digital VGA OLED," SID Digest '00: SID International Symposium Digest of Technical Papers, pp. 912-915, May 2000.

Inukai et al., "4.0-In. TFT-OLED Displays and a Novel Digital Driving Method," SID Digest '00: SID International Symposium Digest of Technical Papers, pp. 924-927, May 2000.

Kido et al., "Multilayer White Light-Emitting Organic Electroluminescent Device," Science, vol. 267, pp. 1332-1334, Mar. 3, 1995.

Yasunori Kijima (Sony), "RGB Multicolor Element," Japan Society of Applied Physics, Molecular Electronics and Bioelectronics Group, 6th training session (1997) text titled "From Fundamentals to Applications of Organic EL Elements," by Japan Society of Applied Physics (Corp.)—Molecular Electronics and Bioelectronics Group, Dec. 11, 1997, pp. 155-163 (with full English Translation, pp. 1-16).

Japanese Office Action, Application Serial No. 2001-169098, dated Jul. 4, 2006, with English Translation.

Ohtani, H., et al.; "LP-B: Late-News Poster: A 60-in. HDTV Rear-Projector with Continuous-Grain-Silicon Technology," SID Digest '98: SID International Symposium Digest of Technical Papers, 1998; pp. 467-470.

Koyama, J., et al.; "A 4.0-in. Poly SI TFT-LCD with Integrated 6-bit Digital Data Driver Using CGS Technology," AM-LCD '99 Digest of Technical Papers, 1999; pp. 29-32.

Tsutsui, T. et al.; "High Quantum Efficiency in Organic Light-Emitting Devices with Iridium-Complex as a Triplet Emissive Center;" Japanese Journal of Applied Physics, vol. 38, 1999, Part 2, No. 12B, L1502-L1504.

Baldo, M.A., et al.; "High-efficiency flourescent organic light-emitting devices using a phosphorescent sensitizer;" Nature, vol. 403, Feb. 17, 2000; pp. 750-753.

J. Koyama, "Taking Basic Patents of Circuit for Achieving Higher Definition of Organic EL Panel", Nikkei Electronics, No. 768, Apr. 24, 2000, pp. 163-170 and full English Translation.

"The Rise of Organic EL Aiming at 'Mobile Phones'", Nikkei Electronics, No. 765, Mar. 13, 2000, pp. 55-62 and full English Translation.

"2mm Thick Self-Emitting Display Device", Nikkei Sangyo Shimbun, Sep. 27, 1995, pp. 1 and full English Translation.

* cited by examiner

LIGHT-EMITTING DEVICE HAVING TRIPLET AND SINGLET COMPOUND IN LIGHT-EMITTING LAYERS

CROSS-REFERENCE TO RELATED APPLICATIONS

This application is a continuation application of U.S. application Ser. No. 09/871,805, filed Jun. 4, 2001, now allowed, which claims the benefit of a foreign priority application filed in Japan as Serial No. 2000-168325 on Jun. 5, 2000. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a device (hereinafter, referred to as a light emitting device) having an element (hereinafter, referred to as a light emitting element) sandwiching a luminous material between electrodes. In particular, the present invention relates to a light emitting device having a light emitting element (hereinafter, referred to as an EL element) using an organic compound from which EL (electro luminescence) is obtained as a luminous material. Note that, an organic EL display and an organic light emitting diode (OLED) are included in a light emitting device of the present invention.

Further, the luminous materials that may be used for the present invention include all the luminous materials that luminesce (phosphorescence and/or fluorescence) via a singlet excitation or a triplet excitation, or via both the excitations.

2. Description of the Related Art

In recent years, the development of an EL element with an organic EL film as a light emitting layer is progressing, and the EL elements using various organic EL films have been proposed. Also, experiments to realize a flat panel display using a light emitting device with such an EL element as a light emitting element have been conducted.

As a light emitting device using an EL element, there are known a passive matrix type and an active matrix type. The passive matrix type light emitting device is provided with stripe shaped anode and cathode which are orthogonal to each other, and uses an EL element having a structure sandwiching an EL film between the anode and the cathode. Further, the active matrix type light emitting device is provided with a thin film transistor (hereinafter, referred to as a TFT) for each pixel, and is of a method for controlling current flowing in the EL element by the TFT connected to one of an anode and a cathode of an EL element.

Further, there are proposed various methods for color display of a light emitting device using EL elements. There is known a method for performing color display by mixing luminescence of colors, with three pixels, a pixel which emits red light, a pixel which emits green light and a pixel which emits blue light as one unit.

Such a method is attracting attention since a bright color display is easily obtained. However, since the EL elements which emit light of respective colors use different organic EL films as light emitting layers, the brightness characteristic of the light emitting layer (the relationship between operation voltage and the brightness) differs. As a result, the operation voltage necessary in obtaining a desired brightness differs for each EL element, and further the reliability (life) of the light emitting layer differs for each EL element.

From the above, it is feared that not only there will be an increase in the kinds of power sources necessary for the light emitting device, but also that a shift in the color balance due to difference in the life (deterioration rate) of the EL element will be generated.

SUMMARY OF THE INVENTION

The present invention has been made in view of the above problem, and therefore an object of the present invention is to provide a technique for keeping operation voltages of an EL element with red light emission, an EL element with green light emission and an EL element with blue light emission at a constant level, when a light emitting device is made to perform color display. Another object of the present invention is to provide a light emitting device that can perform color display with good color balance.

A further object of the present invention is to provide an electric appliance which has a display portion with high image quality, by employing the light emitting device which may perform color display with good color balance as its display portion.

In the present invention, there is a feature in that as a light emitting layer, an organic compound which emits light by a singlet exciton (singlet) (hereinafter, referred to as a singlet compound), and an organic compound which emits light by a triplet exciton (triplet) (hereinafter, referred to as a triplet compound) are used together. Note that, in this specification, the singlet compound refers to a compound which emits light via only a singlet excitation, and the triplet compound refers to a compound which emits light via only a triplet excitation.

As to a triplet compound, the organic compounds disclosed in the following articles may be given as typical materials.

(1) T. Tsutsui, C. Adachi, S. Saito, Photochemical Processes in Organized Molecular Systems, ed. K. Honda, (Elsevier Sci. Pub., Tokyo, 1991) p. 437.

(2) M. A. Baldo, D. F. O☐Brien, Y. You, A. Shoustikov, S. Sibley, M. E. Thompson, S. R. Forrest, Nature 395 (1998) p. 151.

In these articles are disclosed the organic compounds shown by the following formulas.

(3) M. A. Baldo, S. Lamansky, P. E. Burrows, M. E. Thompson, S. R. Forrest, Appl. Phys. Lett., 75 (1999) p. 4.

(4) T. Tsutsui, M. J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

Further, the present inventors consider that not only the luminous materials disclosed in the above articles, but also the luminous materials represented by the following molecular formulas (specifically a metal complex or an organic compound) may be used.

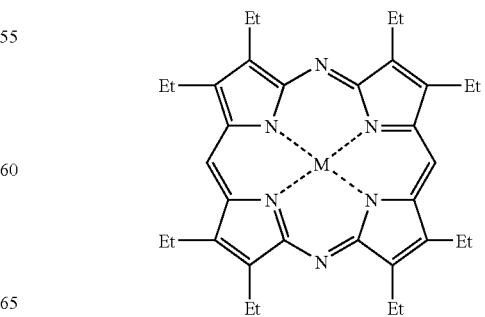

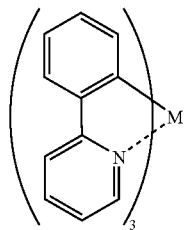

In the above molecular formulas, M represents an element belonging to Groups 8 to 10 of the periodic table. In the above articles, platinum and iridium are used. Further, the present inventors consider that since nickel, cobalt and palladium are cheaper than platinum and iridium, they are more preferable in reducing the manufacturing cost of the light emitting device. Especially, since nickel can easily form a complex, the productivity is high and therefore preferable.

The triplet compound has higher luminous efficiency than the singlet compound, and the operation voltage (a voltage necessary for making an EL element emit light) may be decreased in obtaining the same light emitting brightness. This embodiment makes use of this feature.

FIG. 1 shows a cross sectional structure of a pixel portion of the light emitting device of the present invention. In FIG. 1, reference numeral 10 indicates an insulator, reference numeral 11 indicates a current controlling TFT, reference numeral 12 indicates a pixel electrode (anode), reference numeral 13 indicates an insulating film with an opening on the pixel electrode (hereinafter, referred to as a bank), reference numeral 14 indicates a hole injecting layer, reference numeral 15 indicates a light emitting layer which emits red light, reference numeral 16 indicates a light emitting layer which emits green light, reference numeral 17 indicates a light emitting layer which emits blue light, reference numeral 18 indicates an electron transporting layer, and reference numeral 19 indicates a cathode.

Note that, FIG. 1 shows an example of using a bottom gate type TFT (specifically an inverted stagger type TFT) as a current controlling TFT, but a top gate type TFT may be used. Further, known organic compounds or inorganic compounds may be used for the hole injecting layer 14, the light emitting layer 15 which emits red light, the light emitting layer 16 which emits green light, the light emitting layer 17 which emits blue light, or the electron transporting layer 18, respectively.

In this embodiment, the triplet compound is used as the light emitting layer 15 which emits red light, and the singlet compound is used as the light emitting layer 16 which emits green light and the light emitting layer 17 which emits blue light. That is, an EL element using a triplet compound is used as an EL element which emits red light, and an EL element using a singlet compound is used as an EL element which emits green or blue light.

When using a low molecular organic compound as a light emitting layer, at present the life of a light emitting layer which emits red light is shorter than that of a light emitting layer which emits other colored light. This is because the luminous efficiency is lower than that of other colors, and in order to obtain the same light emitting brightness as other colors, the operation voltage has to be set higher and progress of deterioration for that amount is fast.

However, in the present invention, since the triplet compound with high luminous efficiency is used as the light emitting layer 15 which emits red light, the operation voltages may be made the same whilst the same luminous brightness as the light emitting layer 16 which emits green light and the light emitting layer 17 which emits blue light may be obtained. Accordingly, the deterioration of the light emitting layer 15 which emits red light does not progress significantly, and color display may be performed without causing a problem of shift in color balance, or the like. Further, suppressing the operation voltage as low is preferable also from the point of view that the margin of the withstand pressure of the transistor may be set low. Note that, in the present invention, an example of using the triplet compound as the light emitting layer 15 which emits red light is shown, but further by using the triplet compound for the light emitting layer 16 which emits green light and the light emitting layer 17 which emits blue light, the operation voltages of the respective EL elements may be made the same.

Next, a circuit structure of a pixel portion of the light emitting device of the present invention is shown in FIGS. 2A and 2B. Note that, here a pixel including an EL element which emits red light (pixel (red)) 20a, a pixel including an EL element which emits green light (pixel (green)) 20b, and a pixel including an EL element which emits blue light (pixel (blue)) 20c are shown, and all the pixels have the same circuit structure.

In FIG. 2A, reference numerals 21 indicates a gate wiring, reference numerals 22a to 22c indicate source wirings (data wiring), and reference numerals 23a to 23c indicate current supply lines. The current supply lines 23a to 23c are wirings which determine the operation voltages of the EL elements, and the same voltage is applied to any of the pixels, the pixel 20a which emits red light, the pixel 20b which emits green light and the pixel 20c which emits blue light. Accordingly, the line width (thickness) of the wiring may all have the same design.

Further, reference numerals 24a to 24c indicate switching TFTs (TFTs for controlling the signal to be input to the gate of the current controlling TFT), and here the switching TFTs are formed of n-channel TFTs. Note that, here a structure where two channel forming regions exist between a source region and a drain region is illustrated, but there may be one or more than two channel forming regions.

Further, reference numerals 25a to 25c indicate current controlling TFTs (TFTs for controlling the current flowing in the EL element), and gate electrodes of the current controlling TFTs 25a to 25c are respectively connected to the switching TFTs 24a to 24c, source regions of the current controlling TFTs 25a to 25c are respectively connected to the current supply lines 23a to 23c, drain regions of the current controlling TFTs 25a to 25c are respectively connected to EL elements 26a to 26c. Note that, reference numerals 27a to 27c indicate capacitors which maintain the voltage applied to the gate electrodes of the respective current controlling TFTs 25a to 25c. However, the capacitor 27a to 27c may be omitted.

Note that, FIG. 2A shows an example where the switching TFTs 24a to 24c formed of n-channel TFTs and the current controlling TFTs 25a to 25c formed of p-channel TFTs are provided. However, as shown in FIG. 2B, for pixel (red) 30a, pixel (green) 30b and pixel (blue) 30c, switching TFTs 28a to 28c formed of p-channel TFTs and current controlling TFTs 29a to 29c formed of n-channel TFTs may also be provided, respectively.

Further, FIGS. 2A and 2B show an example where two TFTs are provided in one pixel, but the number of TFTs may be three or more (typically 3 to 6). In such a case, the n-channel TFTs and the p-channel TFTs may be combined in any way to be provided.

In FIGS. 2A and 2B, the EL element 26a is an EL element emitting red color, and a triplet compound is used as a light emitting layer. Further, the EL element 26b is an EL element which emits green light, the EL element 26c is an EL element which emits blue light, and both use a singlet compound as the light emitting layer.

As described above, by using the triplet compound and the singlet compound properly, the operation voltages of the EL element which emits red light, the EL element which emits green light and the EL element which emits blue light may all be the same (10 V or less, preferably 3 to 10 V). Accordingly, it is possible to suppress the shift in color balance due to the difference in the life of the EL element, and the power source necessary for the light emitting device may be unified at 3 V or 5 V. Thus, there is an advantage that the circuit design becomes easier.

DETAILED DESCRIPTION OF THE PREFERRED EMBODIMENTS

Embodiments of the present invention will be described in detail referring to the following embodiments.

Embodiment 1

Figure 1:
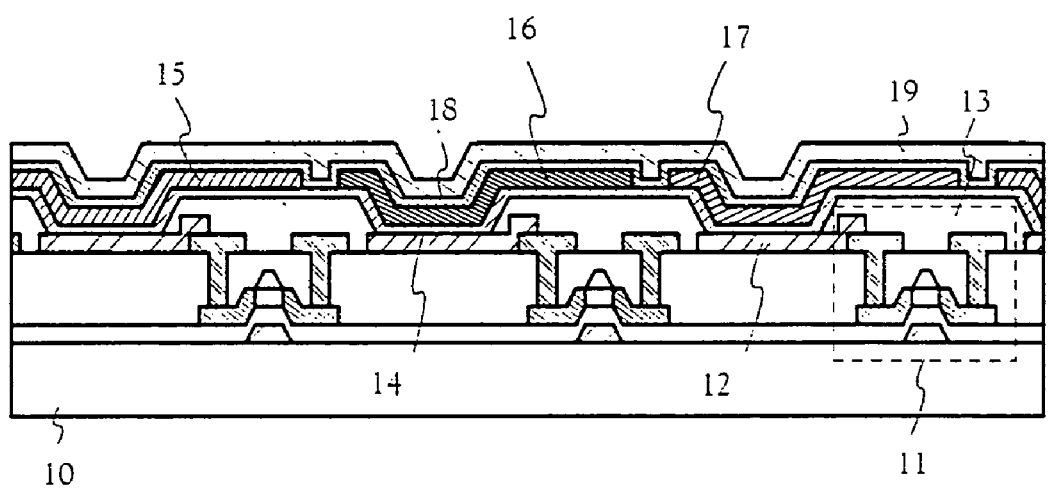
FIG. 1 is a diagram showing a cross sectional structure of a pixel portion of a light emitting device of the present invention.

In this embodiment, as a light emitting device of the present invention, an example of a light emitting device is shown, in which the device has a pixel portion 151 and a driver circuit 150 which drives the pixel portion on the same insulator (however, in a state before sealing). Note that, a CMOS circuit as a basic unit is shown for the driver circuit 150, and one pixel is shown for the pixel portion 151. However, in actuality the structure of the pixel portion is made by gathering a plurality of pixels as shown in FIG. 1.

Figure 2A:
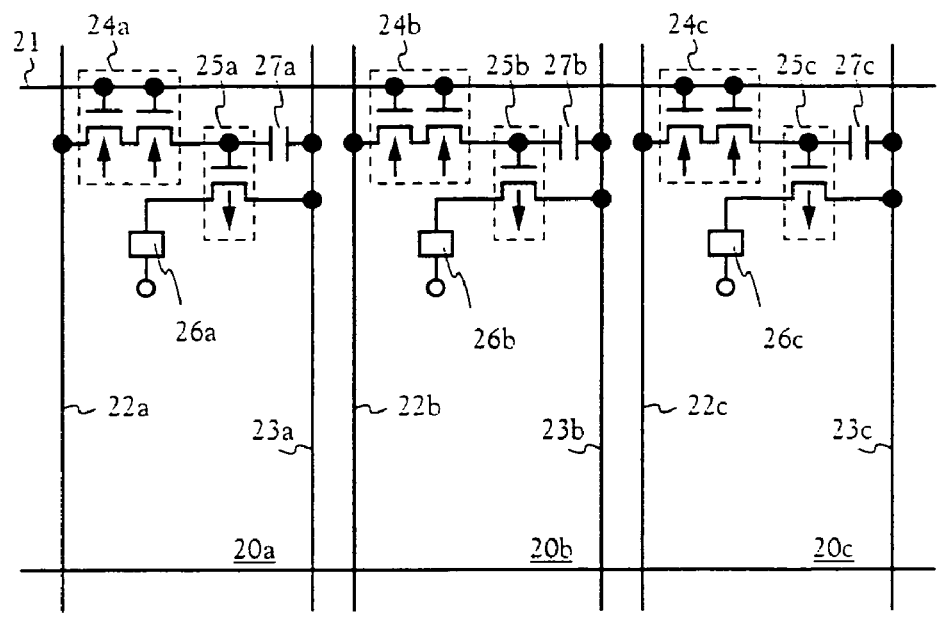
FIGS. 2A and 2B are diagrams showing circuit structures of the pixel portion of the light emitting device of the present invention.
Figure 3:
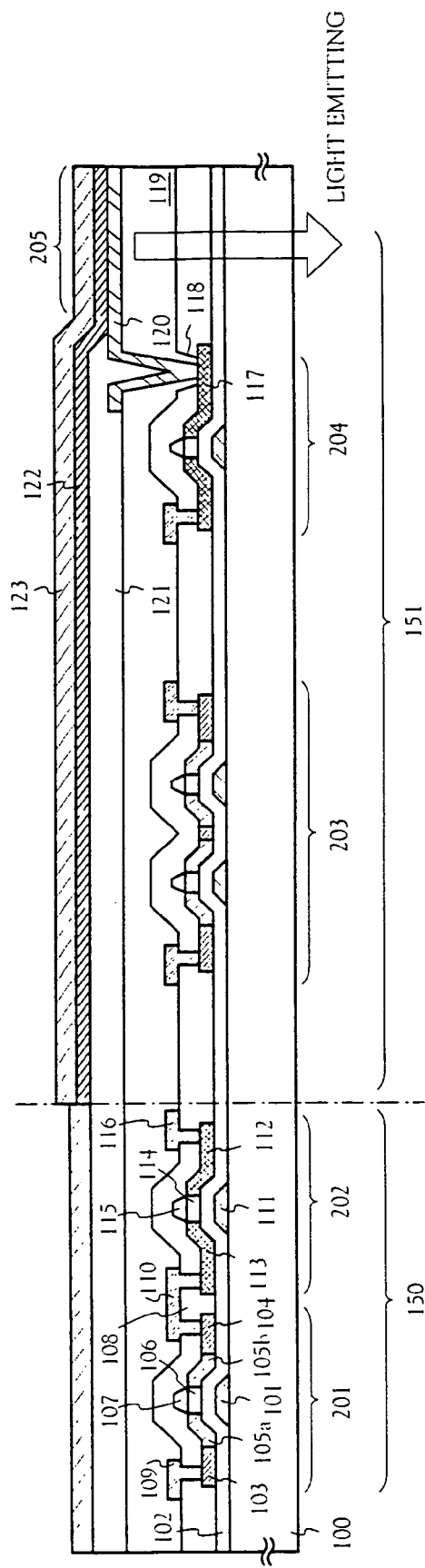
FIG. 3 is a diagram showing a cross sectional structure of a pixel portion of a light emitting device of Embodiment 1.

In FIG. 3, reference numeral 100 indicates an insulator (including an insulating substrate, an insulating film or a substrate having an insulating film on the surface), with an n-channel TFT 201, a p-channel TFT 202, a switching TFT 203 formed of an n-channel TFT, and a current controlling TFT 204 formed of a p-channel TFT formed thereon. At this time, the circuit structure of the pixel portion is the structure shown in FIG. 2A. Further, in this embodiment, the TFTs are all formed of inverted stagger type TFTs.

First, the structures of the n-channel TFT 201 and the p-channel TFT 202 are described.

In the n-channel TFT 201, reference numeral 101 indicates a gate electrode, reference numeral 102 indicates a gate insulating film, reference numeral 103 indicates a source region, reference numeral 104 indicates a drain region, reference numerals 105a and 105b indicate LDD (light doped drain) regions, reference numeral 106 indicates a channel forming region, reference numeral 107 indicates a channel protective film, reference numeral 108 indicates a first interlayer insulating film, reference numeral 109 indicates a source wiring, and reference numeral 110 indicates a drain wiring.

In the p-channel TFT 202, reference numeral 111 indicates a gate electrode, reference numeral 102 indicates the gate insulating film, reference numeral 112 indicates a source region, reference numeral 113 indicates a drain region, reference numeral 114 indicates a channel forming region, reference numeral 115 indicates a channel protective film, reference numeral 108 indicates the first interlayer insulating film, reference numeral 116 indicates a source wiring and reference numeral 110 indicates the drain wiring. The drain wiring 110 is a wiring which is common with the n-channel TFT 201.

The switching TFT 203 has a structure having two channel forming regions between a source region and a drain region. It may be easily understood with reference to the description of the structure of the n-channel TFT 201, and thus, the explanation is omitted. Further, with reference to the description of the structure of the p-channel TFT 202, the current controlling TFT 204 may be easily understood, and therefore the explanation is omitted.

Then, a second interlayer insulating film Leveling film) 119 is provided covering the n-channel TFT 201, the p-channel TFT 202, the switching TFT 203 and the current controlling TFT 204.

Note that, before the second interlayer insulating film 119 is provided, a contact hole 118 is provided in the first interlayer insulating film 108 over a drain region 117 of the current controlling TFT 204. This is for making the etching process easy when forming a contact hole in the second interlayer insulating film 119. Further, in the second interlayer insulating film 119, a contact hole is formed to reach the drain region 117, and a pixel electrode 120 connected to the drain region 117 is provided. The pixel electrode 120 functions as an anode of the EL element, and a conductive film with a large work function, typically an oxide conductive film is used. As the oxide conductive film, indium oxide, tin oxide, zinc oxide or a compound thereof may be used.

Next, reference numeral 121 indicates a bank, which is an insulating film provided to cover an end portion of the pixel electrode 120. The bank 121 may be formed of an insulating film or a resin film including silicon. When using a resin film, carbon particles or metal particles are added so that the resistance of the resin film is made $1\_10^6$ to $1\_10^{12}$ Ωm (preferably $1\_10^8$ to $1\_10^{10}$ Ωm). Thus, dielectric breakdown at the time of film formation may be suppressed.

Next, reference numeral 122 indicates an EL layer. Note that, in this specification, a laminate body with a hole injecting layer, a hole transporting layer, a hole preventing layer, an electron transporting layer, an electron injecting layer or an electron preventing layer combined with a light emitting layer is referred to as an EL layer. It is a feature of the present invention that the singlet compound and the triplet compound are used together as the light emitting layer.

Note that, in this embodiment, the triplet compound is used as an organic compound used in the EL element which emits red light, and the singlet compound is used as an organic compound used in the EL element which emits green light and the EL element which emits blue light. At this time as the triplet compound, the organic compounds mentioned above may be used, and as the singlet compound, an $Alq_3$ (aluminum quinolinolate complex) with a fluorescent pigment coevaporated may be used.

Next, reference numeral 123 indicates a cathode of an EL element, which uses a conductive film with a small work function. As the conductive film with a small work function, a conductive film containing an element belonging to Group 1 or 2 of the periodic table may be used. In this embodiment, a conductive film formed of a compound of lithium and aluminum may be used.

Note that, a laminating body 205 formed of the pixel electrode (anode) 120, the EL layer 122 and the cathode 123 is the EL element. The light emission generated by the EL element 205 is irradiated to the side of the insulator 100 (the direction of the arrow in the figure). Further, when using the p-channel TFT for the current controlling TFT 204 as in this embodiment, the drain region 117 of the current controlling TFT 204 is preferably connected with an anode of the EL element 205.

Note that, although not shown here, after the formation of the cathode 123, it is effective to provide a passivation film to completely cover the EL element 205. The passivation film is formed of an insulating film including a carbon film, a silicon nitride film or a silicon nitride oxide film, and may be formed of a single layer or a lamination layer of the insulating film.

At this time, it is preferable to use a film with good coverage as the passivation film, and it is effective to use a carbon film, especially a DLC (diamond like carbon) film. The DLC film may be formed in a temperature range between a room temperature and 100_C., and therefore, the DLC film may be easily formed above the EL layer 122 with low heat resistance. Further, the blocking effect of the DLC film to oxygen is high, and oxidation of the EL layer 122 may be suppressed. Therefore, the problem of oxidation of the EL layer 122 during the sealing process to be subsequently performed may be prevented.

In the light emitting device of the present invention having the pixel portion and the driver circuit with the above structures, the singlet compound and the triplet compound for the EL elements are used properly, so that the operation voltages of the EL elements may be made the same, and a good color display with excellent color balance may be performed.

Further, the operation voltages of the EL elements may all be made 10V or less (typically 3 to 10V), so that an advantage that the circuit design becomes easy is obtained.

Embodiment 2

In this embodiment, as a light emitting device of the present invention, an example of a light emitting device is shown, in which the device has a pixel portion and a driver circuit which drives the pixel portion on the same insulator (however, in a state before sealing). Note that, a CMOS circuit as a basic unit is shown for the driver circuit 250, and one pixel is shown for the pixel portion 251. However, in practice the structure of the pixel portion is made as shown in FIG. 1. Further, the portions with the same symbols attached as FIG. 3 may refer to the description of Embodiment 1.

Figure 2B:
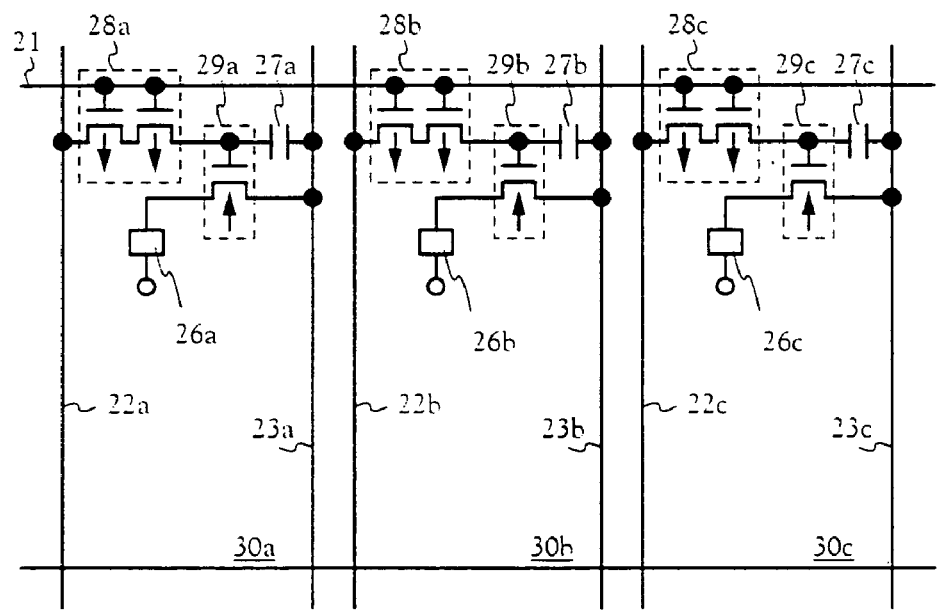
Figure 4:
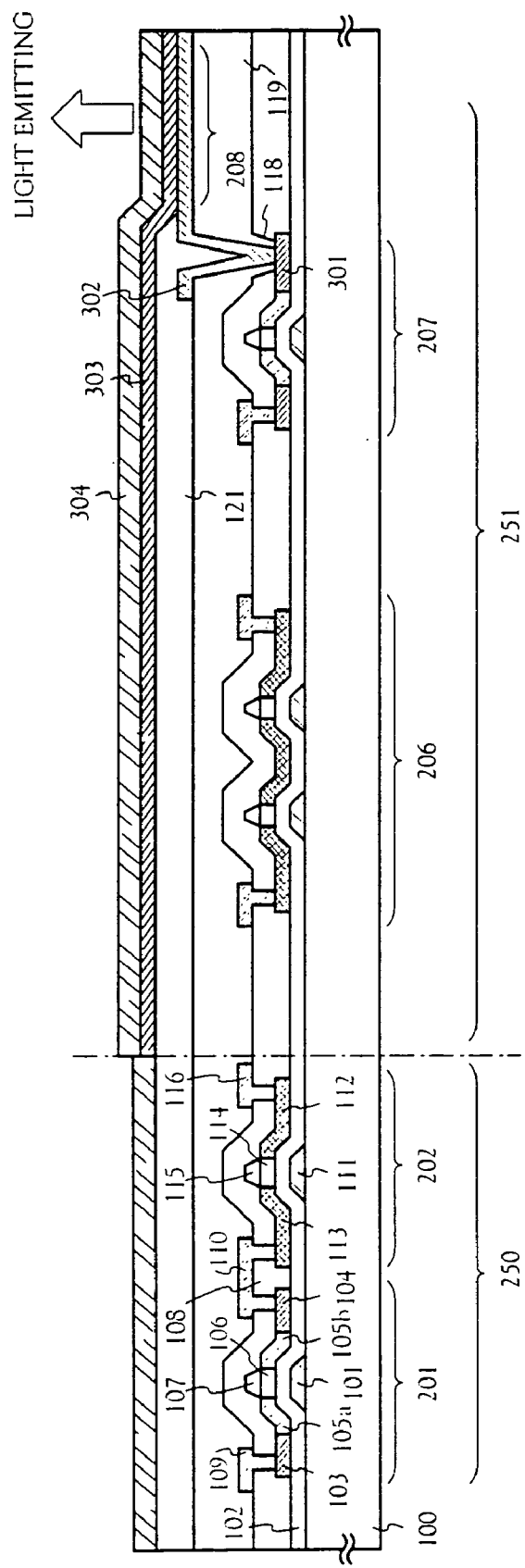
FIG. 4 is a diagram showing a cross sectional structure of a pixel portion of a light emitting device of Embodiment 2.

In FIG. 4, reference numeral 100 indicates the insulator, with the n-channel TFT 201, the p-channel TFT 202, a switching TFT 206 formed of a p-channel TFT, and a current controlling TFT 207 formed of an n-channel TFT formed thereon. At this time, the circuit structure of the pixel portion 251 is the structure shown in FIG. 2B. Further, in this embodiment, the TFTs are all formed of inverted stagger type TFTs.

The descriptions of the n-channel TFT 201 and the p-channel TFT 202 may be referred to Embodiment 1 and thus the descriptions will be omitted. Further, the switching TFT 206 has a structure having two channel forming regions between a source region and a drain region, but may be easily understood by referring to the description of the structure of the p-channel TFT 202. Thus, the description is omitted. In addition, the current controlling TFT 207 may be easily understood by referring to the description of the structure of the n-channel TFT 201, and thus the description is omitted.

In the case of this embodiment, the structure of an EL element differs from that of Embodiment 1. A drain region 301 of the current controlling TFT 207 is connected with a pixel electrode 302. The pixel electrode 302 is an electrode which functions as a cathode of an EL element 208, and is formed using a conductive film containing an element belonging to Group 1 or 2 of the periodic table. In this embodiment, a conductive film formed of a compound of lithium and aluminum is used.

Further, the EL element 208 is formed of the pixel electrode (cathode) 302, an EL layer 303 and an anode 304. Note that, in this embodiment, a triplet compound is used as an organic compound used for an EL element which emits red light, and a singlet compound is used as an organic compound used for an EL element which emits green light and an EL element which emits blue light. At this time, as the triplet compound, the organic compounds mentioned above may be used, and as the singlet compound, an $Alq_3$ (aluminum quinolinolate complex) with a fluorescent pigment coevaporated may be used.

Further, in this embodiment, as the anode 304, an oxide conductive film with gallium oxide added to zinc oxide is used. Since the oxide conductive film transmits visible light, the light generated in the EL element 208 is irradiated toward the top surface of the anode 304 (in the direction of the arrow in the figure). Note that, when using the n-channel TFT for the current controlling TFT 207 as in this embodiment, it is preferable that the drain region 301 of the current controlling TFT 207 is connected to the cathode of the EL element 208.

Note that, although not shown here, after the formation of the anode 304, it is effective to provide a passivation film to completely cover the EL element 208. The passivation film is formed of an insulating film including a carbon film, a silicon nitride film or a silicon nitride oxide film, and may be formed of a single layer or a lamination layer of the insulating film.

In the light emitting device of the present invention having the pixel portion and the driver circuit with the above structures, the singlet compound and the triplet compound for the EL elements are used properly, so that the operation voltages of the EL elements may be made the same, and a good color display with excellent color balance may be performed.

Further, the operation voltages of the EL elements may all be made 10V or less (typically 3 to 10V), so that an advantage that the circuit design becomes easy is obtained.

Note that, the structure of this embodiment may be implemented in combination with the structure in Embodiment 1.

Embodiment 3

Figure 5:
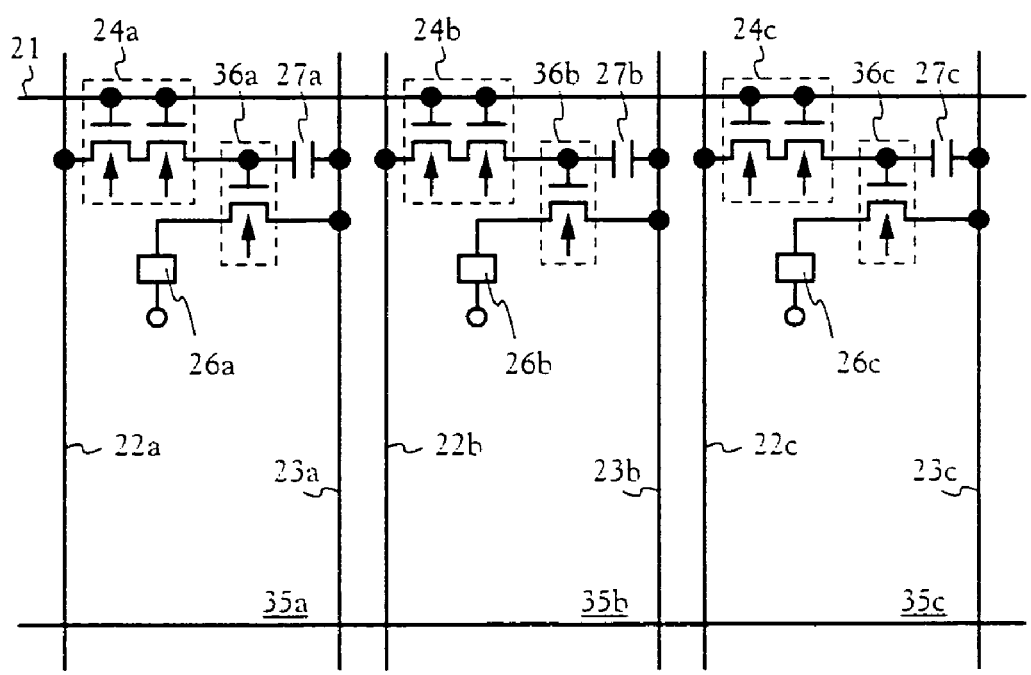
FIG. 5 is a diagram showing a circuit structure of a pixel portion of a light emitting device of Embodiment 3.

In this embodiment, as a light emitting device of the present invention, a case where a pixel portion and a driver circuit are all formed of n-channel TFTs is described. Note that, the circuit structure of a pixel of this embodiment is as shown in FIG. 5. Further, the description in FIGS. 2A and 2B may be referred to for portions with the same symbols attached as in FIGS. 2A and 2B.

As shown in FIG. 5, the switching TFTs 24a to 24c and current controlling TFTs 36a to 36c formed respectively for a pixel (red) 35a, a pixel (green) 35b and a pixel (blue) 35c, are all formed of n-channel TFTs.

Figure 6:
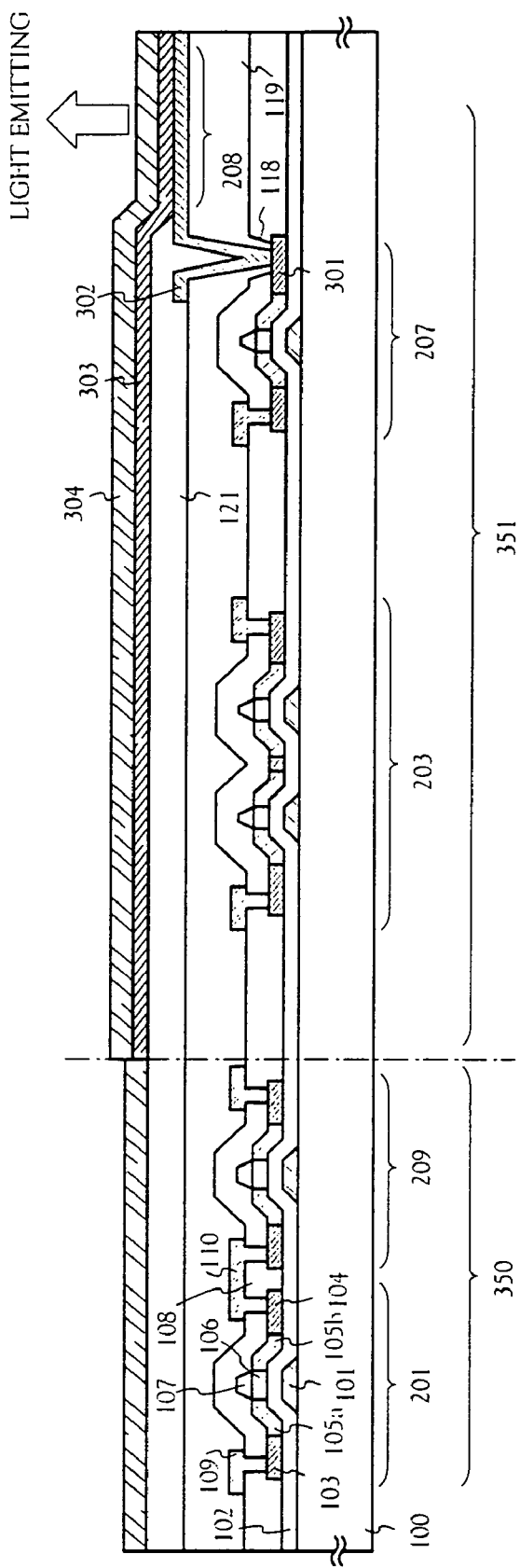
FIG. 6 is a diagram showing a cross sectional structure of the pixel portion of the light emitting device of Embodiment 3.

Here the cross sectional structure of the light emitting device of this embodiment (however, in a state before sealing) is shown in FIG. 6. Note that, a CMOS circuit as a basic unit is shown for the driver circuit 350, and one pixel is shown for the pixel portion 351. However, in actuality the structure of the pixel portion 351 is as shown in FIG. 1. Further, for the portions where the same symbols as in FIGS. 3 and 4 are attached, the description in Embodiments 1 or 2 may be referred to.

In FIG. 6, reference numeral 100 indicates the insulator, with the n-channel TFT 201, an n-channel TFT 209, the switching TFT 203 formed of an n-channel TFT, and the current controlling TFT 207 formed of an n-channel TFT formed thereon. At this time, the circuit structure of the pixel portion is the structure shown in FIG. 5.

Further, in this embodiment, the TFTs are all formed of inverted stagger type TFTs. At this time, the n-channel TFTs may all be enhancement type TFTs, or may all be depression type TFTs. Of course, both may be used properly in combination. The enhancement type or the depression type, may be selected by adding n-type or p-type impurities into the channel forming region.

The n-channel TFT 201 and the n-channel TFT 209 have the same structure. The explanation may be referred to Embodiment 1, and therefore is omitted. Further, the switching TFT 203 has a structure where two channel forming regions exist between a source region and a drain region, and it may be easily understood by referring to the description of the structure of the n-channel TFT 201. Therefore, the description is omitted. Further, the current controlling TFT 207 may easily be understood by referring to the description of the structure of the n-channel TFT 201, and therefore the description is omitted.

In the case of this embodiment, the structure of the EL element is the same as Embodiment 2. That is, in this embodiment, since an n-channel TFT is used for the current controlling TFT 207, it is preferable that the cathode 302 of the EL element 208 is connected to the drain region 301 of the current controlling TFT 207. Embodiment 2 may be referred for the description related to the EL element.

Note that, although not shown here, after the formation of the anode 304, it is effective to provide a passivation film to completely cover the EL element 208. The passivation film is formed of an insulating film including a carbon film, a silicon nitride film or a silicon nitride oxide film, and may be formed of a single layer or a lamination layer of the insulating film.

In the light emitting device of the present invention having the pixel portion 351 and the driver circuit 350 with the above structures, the singlet compound and the triplet compound for the EL elements are used properly, so that the operation voltages of the EL elements may be made the same, and a good color display with excellent color balance may be performed. Further, since all the operation voltages of the EL elements may be made 10 V or less (typically 3 to 10 V), there is obtained an advantage that the circuit design is easily made.

Furthermore, according to the structure of this embodiment, a photolithography process for forming a p-channel TFT can be omitted. Thus, the manufacturing process can be simplified.

Note that the structure of this embodiment can be implemented in combination with the structure described in Embodiment 1 or Embodiment 2.

Embodiment 4

Figure 7:
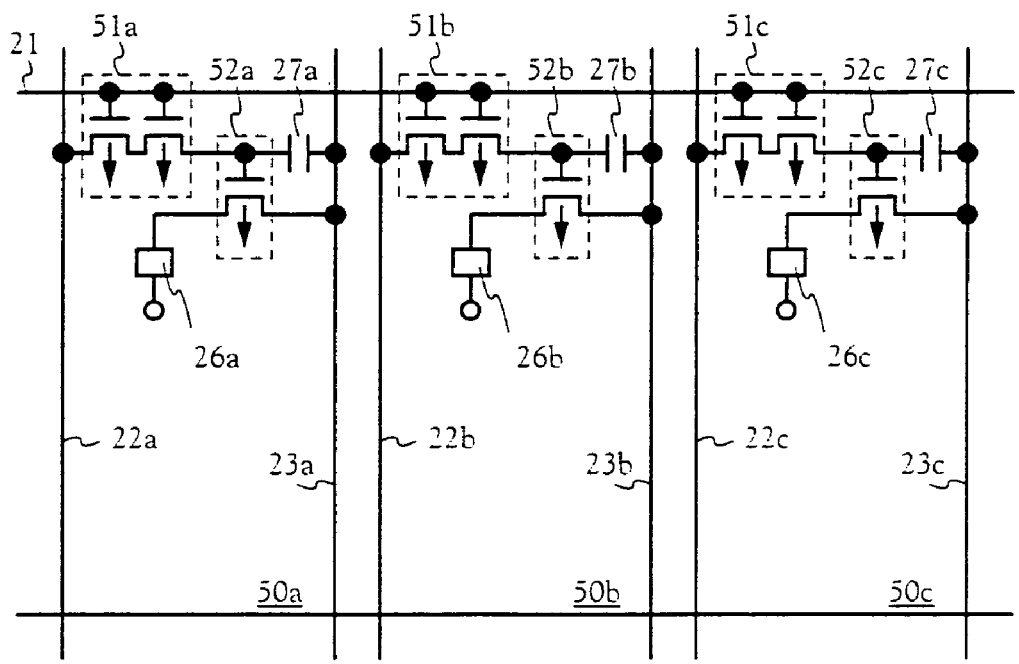
FIG. 7 is a diagram showing a circuit structure of a pixel portion of a light emitting device of Embodiment 4.

In this embodiment, the case where a pixel portion and a driver circuit are all formed of p-channel TFTs in a light emitting device of the present invention is explained. Note that the circuit configuration of a pixel in this embodiment is as shown in FIG. 7. In addition, the explanation for FIGS. 2A and 2B may be referred as to the portions indicated by the same reference symbols as those in FIGS. 2A and 2B.

As shown in FIG. 7, switching TFTs 51a to 51c and current controlling TFTs 52a to 52c, which are respectively provided in a pixel (red) 50a, a pixel green) 50b, and a pixel (blue) 50c, are all formed of p-channel TFTs.

Figure 8:
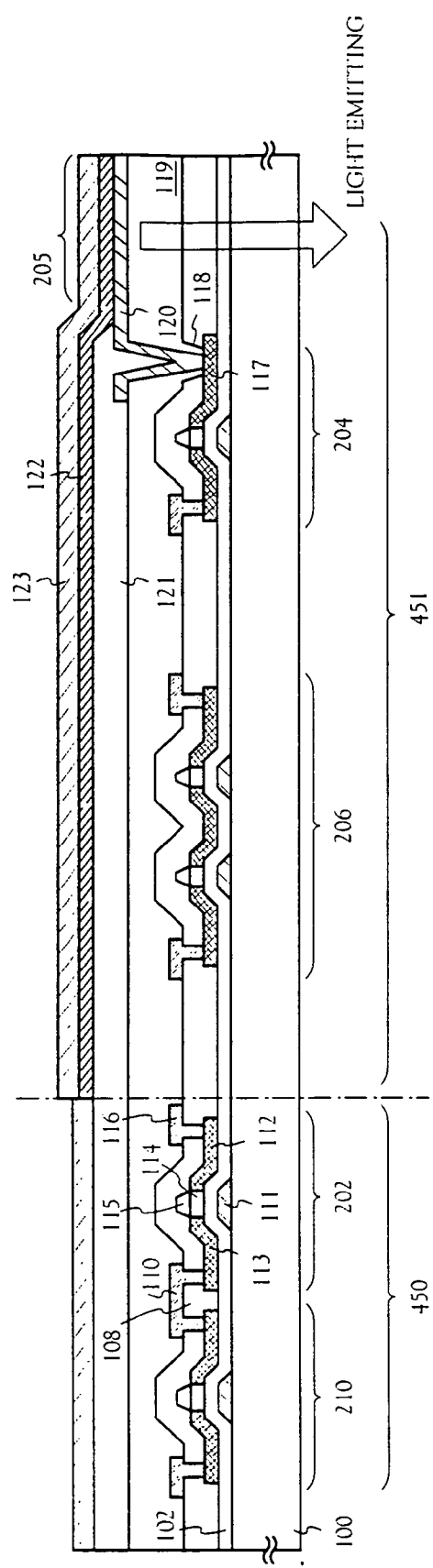
FIG. 8 is a diagram showing a cross sectional structure of the pixel portion of the light emitting device of Embodiment 4.

FIG. 8 shows a cross-sectional structure of the light emitting device in this embodiment (in the state before sealing). Note that a CMOS circuit as a basic unit is shown for the driver circuit and one pixel is shown for the pixel portion. However, in actuality, the structure of the pixel portion is as shown in FIG. 1.

Further, the explanation in Embodiment 1 or Embodiment 2 may be referred to as to the portions indicated by the same reference symbols as those in FIG. 3 or FIG. 4. In FIG. 8, reference numeral 100 indicates the insulator, with a p-channel TFT 210, the p-channel TFT 202, the switching TFT 206 formed of a p-channel TFT, and the current controlling TFT 204 formed of a p-channel TFT formed thereon. At this time, the circuit configuration of the pixel portion 451 is as shown in FIG. 7.

Further, in this embodiment, the TFTs are all formed of p-channel inverted stagger type TFTs. At this time, all the p-channel TFTs may be enhancement type TFTs and may be depression type TFTs. Of course, the p-channel TFTs may be formed of using both types of the TFTs properly in combination. The enhancement type or the depression type may be selected by adding an n-type impurity or a p-type impurity in a channel forming region.

The p-channel TFT 210 and the p-channel TFT 202 have the same structure, and the explanation therefor is omitted since Embodiment 1 may be referred thereto. Further, the switching TFT 206 has the structure in which two channel forming regions are interposed between a source region and a drain region. Since the switching TFT 206 can be easily understood with reference to the explanation for the structure of the p-channel TFT 202, the explanation therefor is omitted. In addition, since the current controlling TFT 204 can be easily understood with reference to the explanation for the p-channel TFT 202, the explanation therefor is omitted.

In case of this embodiment, the structure of an EL element is the same as that in Embodiment 1. That is, in this embodiment, a p-channel TFT is used for the current controlling TFT 204, and thus, it is preferable that the drain region 117 of the current controlling TFT 204 is connected with the anode 120 of the EL element 205. The explanation for the EL element may be referred to Embodiment 1.

Note that although not shown, it is effective to provide a passivation film so as to entirely cover the EL element 205 after the formation of the cathode 123. A single layer or a lamination layer of the insulating film comprising a carbon film, a silicon nitride film, or a silicon oxide nitride film is used for the passivation film.

In a light emitting device of the present invention, which includes the pixel portion 451 and the driver circuit 450 having the above structures, the operation voltages of the EL elements may be made the same since a singlet compound and a triplet compound are properly used for the EL elements. Thus, a good color display with excellent color balance may be realized.

Further, since all the operation voltages of the EL elements may be made 10 V or less (typically 3 to 10 V), there is obtained an advantage that the circuit design is easily made.

Furthermore, according to the configuration of this embodiment, a photolithography process for forming an n-channel TFT can be omitted. Thus, the manufacturing process can be simplified.

Note that the configuration of this embodiment can be implemented in combination with the configuration described in Embodiment 1 or Embodiment 2.

Embodiment 5

An example of using the top gate TFT (specifically planar TFT) as a switching TFT and the current control TFT is shown in this embodiment.

Figure 9:
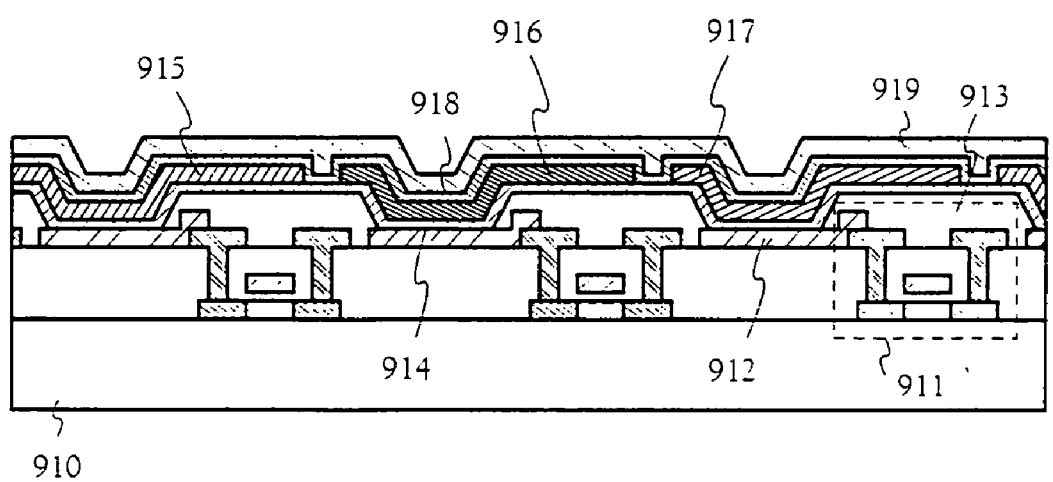
FIG. 9 is a diagram showing a cross sectional structure of a pixel portion of a light emitting device of Embodiment 5.

FIG. 9 shows a cross sectional structure of the pixel portion in the active matrix type light emitting device of this embodiment. In FIG. 9, reference numeral 910 shows an insulator, reference numeral 911 shows a current control TFT, reference numeral 912 shows a pixel electrode (anode), reference numeral 913 shows a bank, reference numeral 914 shows a known hole injecting layer, reference numeral 915 shows a light emitting layer which emits red color, reference numeral 916 shows a light emitting layer which emits green color, reference numeral 917 shows a light emitting layer which emits blue color, reference numeral 918 shows a known electron transporting layer, and reference numeral 919 shows a cathode.

Here in this embodiment, a triplet compound is used as a light emitting layer 915 which emits red color, and a singlet compound is used as a light emitting layer 916 which emits green color and a light emitting layer 917 which emits blue color. That is, an EL element using a singlet compound is an EL element which emits green color or blue color, and an EL element using the above-mentioned triplet compound is an EL element which emits red color.

However, in this embodiment since a triplet compound with high luminous efficiency is used as the light emitting layer 915 which emits red color, the same light emitting brightness as the light emitting layer 916 which emits green color and the light emitting layer 917 which emits blue color may be obtained while the operation voltage is made the same. Accordingly, the deterioration of the light emitting layer 915 which emits red color does not progress significantly, and color display may be performed without causing a problem such as color shift. Further, suppression of the operation voltage is preferable considering that the margin of the resistance of the transistor may be set low.

Note that, in this embodiment an example of using a triplet compound as the light emitting layer 915 which emits red color is shown, and a triplet compound may be used as the light emitting layer 916 which emits green color or the light emitting layer 917 which emits blue color.

A circuit structure in the case this embodiment is implemented is shown in FIG. 2. Note that, the structures of this embodiment may be implemented in combination with any of the structures of Embodiments 1 to 4.

Embodiment 6

Further, the light emitting device of the embodiment after the seal (or encapsulation) step for protecting the EL element is performed will be described with reference to FIGS. 10A and 10B. An example of the seal step of structure shown in Embodiment 1 (FIG. 3). Further the seal structure of this embodiment may be implemented in combination with any of the structures of Embodiments 1 to 5. Note that, reference numerals used in FIG. 3 is cited as needed.

Figure 10A:
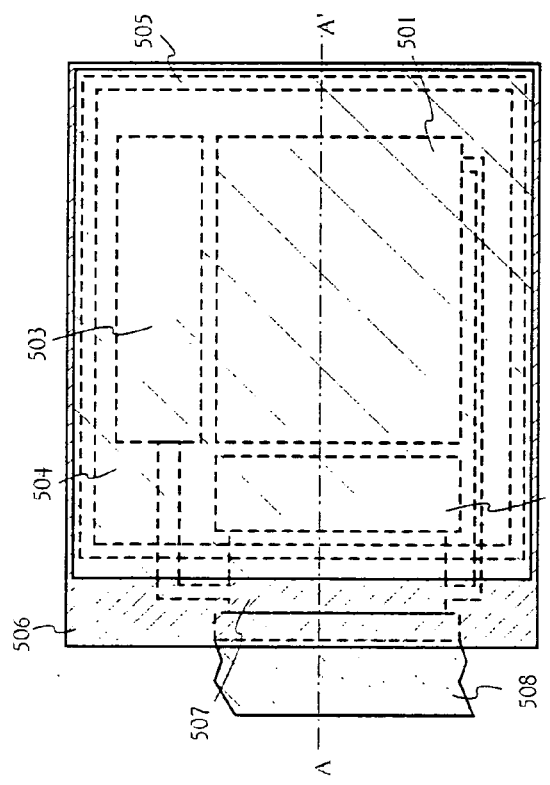
FIGS. 10A and 10B are diagrams showing a structure of a driving circuit built-in light emitting device of Embodiment 6.
Figure 10B:
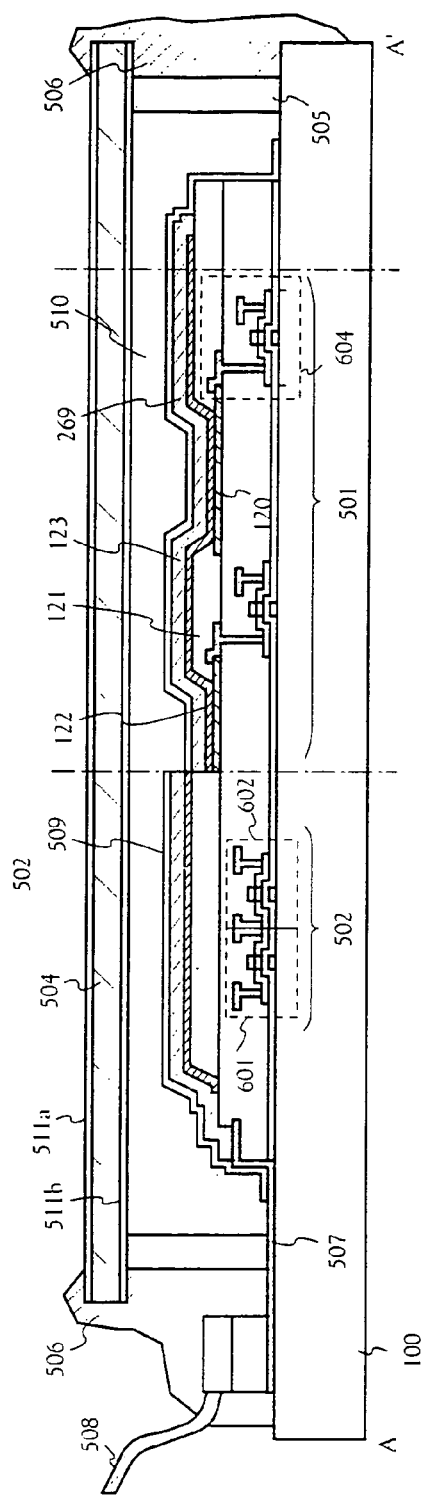

FIG. 10A is a top view showing a state where steps up to sealing of an EL element are performed, and FIG. 10B is a cross sectional view of FIG. 10A taken along with the line A-A'. Reference numeral 501 of a portion shown by a dotted line designates a pixel portion; 502, a source side driving circuit; and 503, a gate side driving circuit. Reference numeral 504 designates a cover member; 505, a first seal member; and 506, a second seal member.

Note that, reference numeral 508 designates a wiring line for transmitting signals inputted to the source side driving circuit 502 and the gate side driving circuit 503, which receives a video signal and a clock signal from an FPC (Flexible Print Circuit) as an external input terminal. Note that although only the FPC is shown here, a print wiring board (PWB) may be attached to the FPC.

Next, a cross sectional structure will be described with reference to FIG. 10B. A pixel portion 501 and a source side driving circuit 502 are formed on the top of an insulator 100, and the pixel portion 501 is formed of a plurality of pixels including a current controlling TFT 204 and a pixel electrode 120 electrically connected to its drain. The source side driving circuit 502 is formed by using a CMOS circuit in which an n-channel TFT 201 and a p-channel TFT 202 are combined. Note that, a polarizing plate (typically, a circular polarizing plate) may be bonded to the insulator 501.

The pixel electrode 120 functions as an anode of the EL element Banks 121 are formed at both ends of the pixel electrode 120, and an EL layer 122 and a cathode 123 of the EL element are formed on the pixel electrode 120. The cathode 123 functions also as a wiring line common to all pixels, and is electrically connected to the FPC 508 through the connection wiring line 507. Further, all elements included in the pixel portion 501 and the source side driving circuit 502 are covered with a passivation film 509.

A cover member 504 is bonded with a fist seal member 505. A spacer may be provided to secure an interval between the cover member 504 and the EL element. A space 510 is formed inside of the first seal member 505. It is desirable that the first seal member 505 is a material which water or oxygen does not permeate. Further, it is effective to provide a material having a moisture absorption effect or a material having an oxidation preventing effect in the inside of the space 510.

Note that, it is appropriate that carbon films (specifically, diamond-like carbon films) 511a and 511b as protection films are formed to a thickness of 2 to 30 nm on the front surface and the rear surface of the cover member 504. The carbon film like this has a role to prevent the infiltration of oxygen and water and to mechanically protect the surface of the cover member 504.

Besides, after the cover member 504 is adhered, a second seal member 506 is provided so as to cover the exposed surface of the first seal member 505. The second seal member 506 can be made of the same material as the first seal member 505.

By encapsulating the EL element in the structure as described above, the EL element can be completely cut off from the outside, and it is possible to prevent a material accelerating deterioration due to oxidation of the EL layer such as moisture or oxygen, from infiltrating from the outside. Accordingly, the light emitting device having high reliability can be obtained.

Note that, as shown in FIGS. 10A and 10B, the light emitting device in which the pixel portion and the driving circuit are provided on the same substrate and the FPC is attached, is especially called a driving circuit built-in light emitting device in the present specification.

Embodiment 7

In Embodiment 6, the driving circuit built-in light emitting device shown in FIGS. 10A and 10B is given as the example in which a pixel portion and a driver circuit are integrally formed on the same insulator. However, it is possible to provide the driver circuit as an external IC (integrated circuit). In this case, the structure is as shown in FIG. 11A.

Figure 11A:
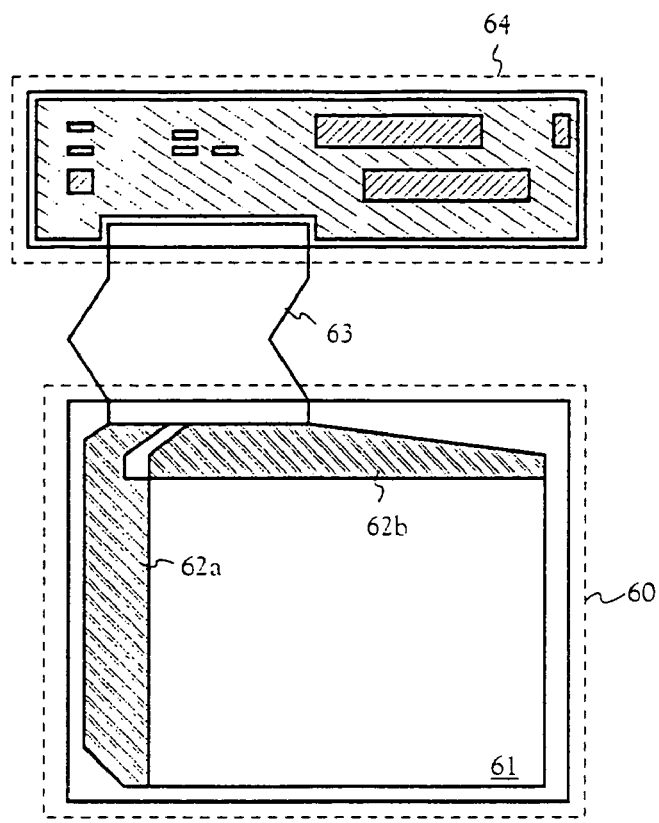
FIGS. 11A and 11B are diagrams showing a structure of a light emitting device externally mounted with a driver circuit of Embodiment 7.

In the module shown in FIG. 11A, a substrate 60 (including a pixel portion 61 and wirings 62*a* and 62*b*), on which the pixel portion including a TFT and an EL element is formed, is provided with an FPC 63, and a printed wiring board 64 is attached to the substrate 60 through the FPC 63. Here, FIG. 11B is a functional block diagram of the printed wiring board 64.

Figure 11B:
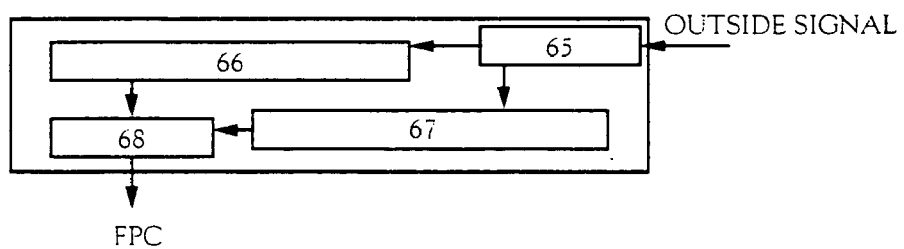

As shown in FIG. 11B, an IC functioning as at least I/O ports (also referred to as input or output portions) 65 and 68, a source driver circuit 66, and a gate driver circuit 67 is provided inside the printed wiring board 64.

As described above, a module in which an FPC is attached to a substrate on which a pixel portion is formed, and a printed wiring board having a function of a driver circuit is attached to the substrate through the FPC is referred to as a light emitting module with an external driver circuit particularly in this specification.

Figure 12A:
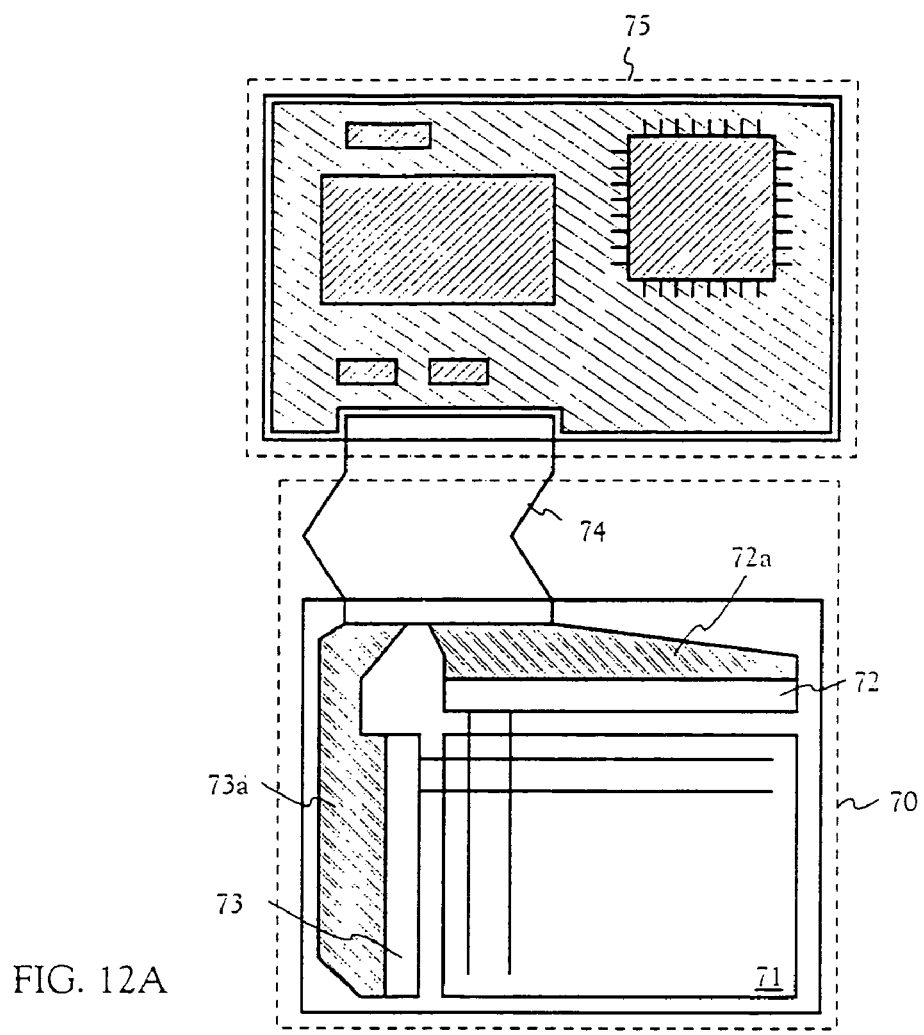
FIGS. 12A and 12B are diagrams showing a structure of a light emitting device externally mounted with a controller of Embodiment 7.

Further, in the module shown in FIG. 12A, an FPC 74 is attached to a driving circuit built-in light emitting device 70 (including a pixel portion 71, a source driver circuit 72, a gate driver circuit 73, and wirings 72*a* and 73*a*), and a printed wiring board 75 is attached to the light emitting device 70 through the FPC 74. Here, FIG. 12B is a functional block diagram of the printed wiring board 75.

Figure 12B:
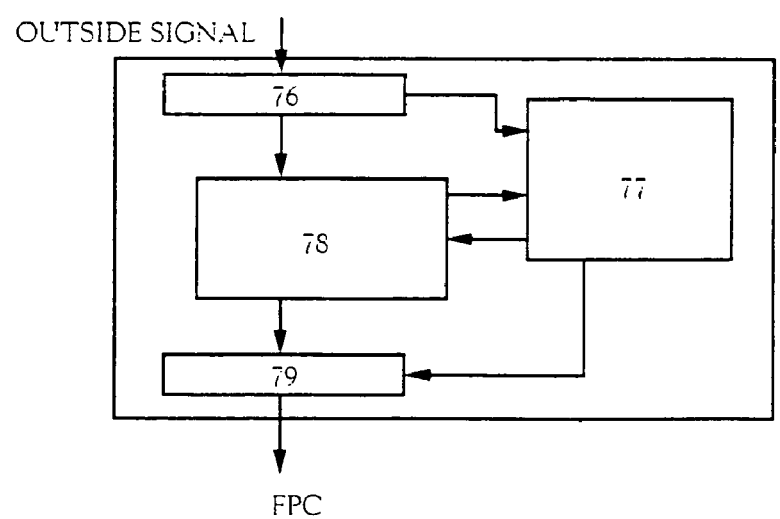

As shown in FIG. 12B, an IC functioning as at least I/O ports 76 and 79, and a control portion 77 is provided inside the printed wiring board 75. Note that a memory portion 78 is provided here, but it is not necessarily required. Further, the control portion 77 has a function for controlling a driver circuit, correction of image data and the like.

As described above, a module in which a printed wiring board having a function of a controller is attached to a driving circuit built-in light emitting device in which a pixel portion and a driver circuit are formed on a surface of a substrate is referred to as a light emitting module with an external controller particularly in this specification.

Embodiment 8

The light-emitting device (including the module of which state is shown in Embodiment 7) formed by implementing this invention may be used as a display portion of various electrical apparatuses. As electrical apparatuses of this invention, there are such as a video camera, a digital camera, a goggle type display (head mounted display), a navigation system, a audio equipment, a note type personal computer, a game apparatus, a portable information terminal (such as a mobile computer, a portable telephone, a portable game apparatus or an electronic book), and an image playback device with a recording medium. Specific examples of the electronic equipment are shown in FIGS. 13A-13B and 14A-14B.

Figure 13A:
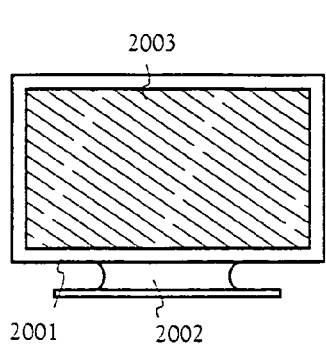
FIGS. 13A to 13F are diagrams showing specific examples of electric apparatus of Embodiment 8.

FIG. 13A shows an EL display and includes a casing 2001, a supporting base 2002 and a display portion 2003. The light-emitting device of this invention may be used for the display portion 2003. When using the EL light-emitting device in the display portion 2003, it is a self-light emitting type so that a back light is not necessary and the display portion may be made thin.

Figure 13B:
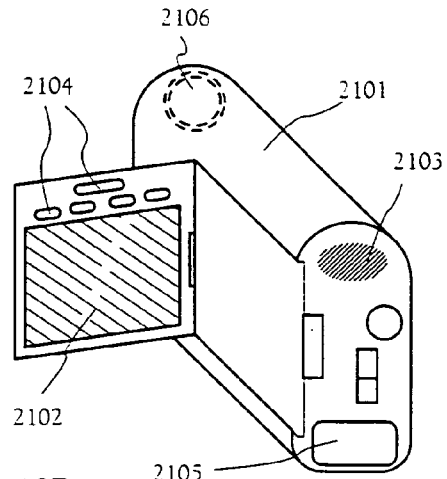

FIG. 13B shows a video camera, which contains a main body 2101, a display portion 2102, a sound input portion 2103, operation switches 2104, a battery 2105, and an image receiving portion 2106. The light-emitting device and the liquid crystal display device of this invention can be applied to the display portion 2102.

Figure 13C:
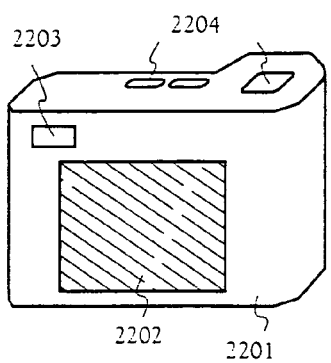

FIG. 13C shows a digital camera, which contains a main body 2201, a display portion 2202, a eye contact portion 2203, and operation switches 2204. The light emitting-device of this invention can be applied to the display portion 2202.

Figure 13D:
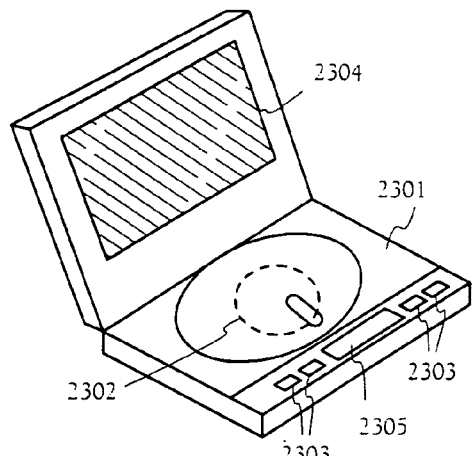

FIG. 13D shows an image playback device equipped with a recording medium (specifically, a DVD playback device), which contains a main body 2301, a recording medium (such as a CD, LD or DVD) 2302, operation switches 2303, a display portion (a) 2304, a display portion (b) 2305 and the like. The display portion (a) is mainly used for displaying image information. The display portion (b) 2305 is mainly used for displaying character information. The light-emitting device of this invention can be applied to the display portion (a) and the display portion (b). Note that, the image playback device equipped with the recording medium includes devices such as CD playback device, and game machines.

Figure 13E:
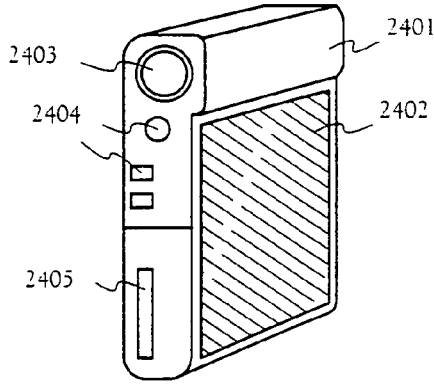

FIG. 13E shows a portable (mobile) computer, which contains a main body 2401, a display portion 2402, an image receiving portion 2403, operation switches 2404 and a memory slot 2405. The light-emitting device of this invention can be applied to the display portion 2402. This portable computer may record information to a recording medium that has accumulated flash memory or involatile memory, and playback such information.

Figure 13F:
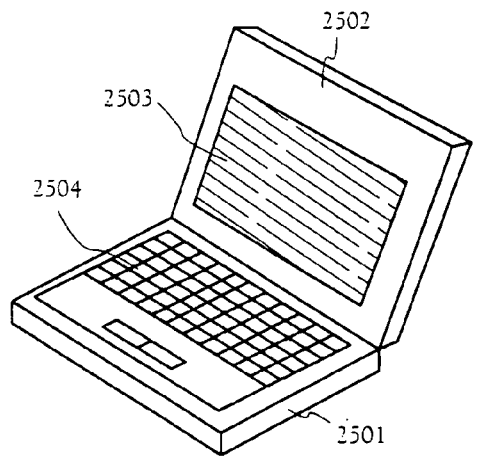

FIG. 13F shows a personal computer, which contains a main body 2501, a casing 2502, a display portion 2503, and a keyboard 2504. The light-emitting device of this invention can be applied to the display portion 2503.

The above electronic apparatuses more often display information sent through electron communication circuits such as the Internet or the CATV (cable television), and especially image information display is increasing. When using the light-emitting device having the EL element in the display portion, since the response speed of the EL element is extremely fast, it becomes possible to display pictures without delay.

Further, since the light emitting portion of the light-emitting device consumes power, it is preferable to display information so that the light emitting portion is as small as possible. Therefore, when using the light-emitting device in the portable information terminal, especially in the display portion where character information is mainly shown in a cellular phone or an audio equipment, it is preferable to drive so that the character information is formed of a light emitting portion with the non-light emitting portion as a background.

Figure 14A:
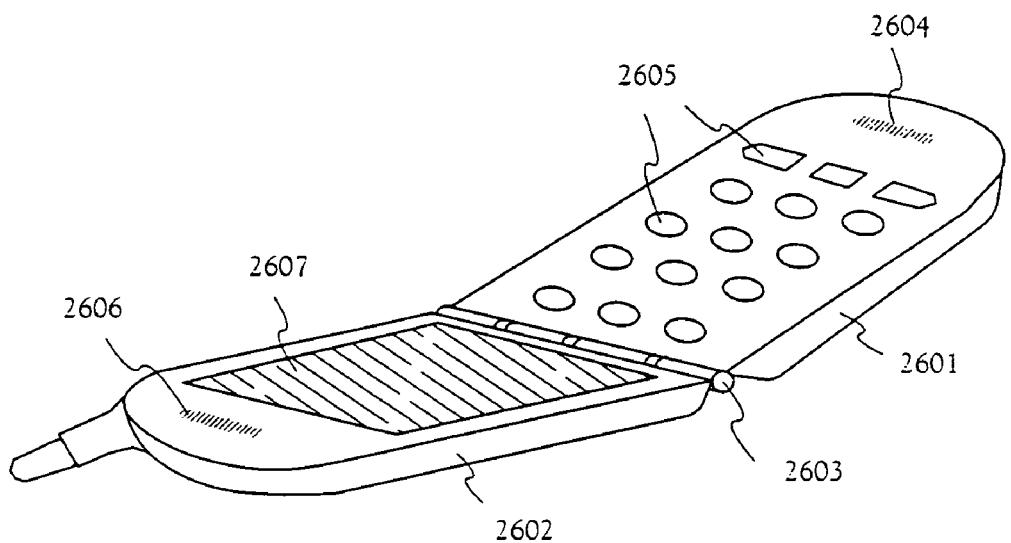
FIGS. 14A and 14B are diagrams showing other specific examples of electric apparatus of Embodiment 8.

Here, FIG. 14A shows a portable telephone, and reference numeral 2601 shows a portion (operation portion) which performs key operation, and reference numeral 2602 shows a portion which performs information display (information display portion), and the operation portion 2601 and the information display portion 2602 are connected by the connecting portion 2603. Further, the operation portion 2601 is provided with a sound input portion 2604, operation switches 2605, and the information display potion 2602 is provided with a sound output portion 2606, a display portion 2607.

The light-emitting device of this invention may be used as the display portion 2607. Note that, when using the light-emitting device to the display portion 2607, the consumption power of the portable telephone may be suppressed by displaying white letters in the background of the black color.

In the case of the portable telephone shown in FIG. 14A, the light-emitting device used in the display portion 2604 is incorporated with a sensor (a CMOS sensor) by a CMOS circuit, and may be used as an authentication system terminal for authenticating the user by reading the fingerprints or the hand print of the user. Further, light emission may be performed by taking into consideration the brightness (illumination) of outside and making information display at a contrast that is already set.

Further, the low power consumption may be attained by decreasing the brightness when using the operating switch 2605 and increasing the brightness when the use of the operation switch is finished. Further, the brightness of the display portion 2604 is increased when a call is received, and low power consumption is attained by decreasing the brightness during a telephone conversation. Further, when using the telephone continuously, by making it have a function so that display is turned off by time control unless it is reset, low power consumption is realized. It should be noted that this control may be operated by hand.

Figure 14B:
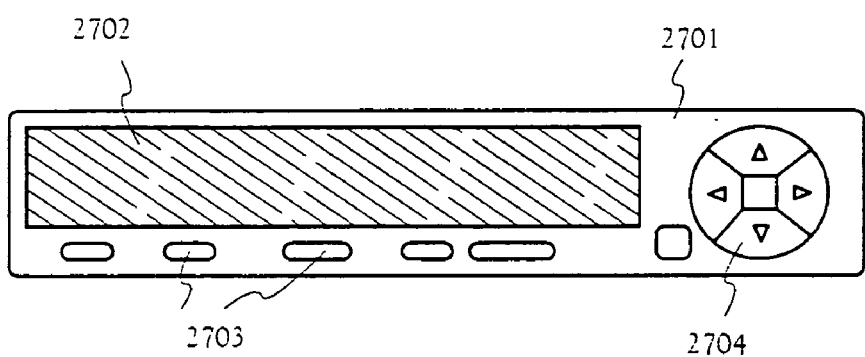

Further, FIG. 14B shows a car mounted type audio, which contains a casing 2701, a display portion 2702, and operation switches 2703 and 2704. The light-emitting device this invention can be applied to the display portion 2702. Further, in this embodiment, a car mounted audio (car audio) is shown, but it may be used in a fixed type audio (audio component). Note that, when using a light-emitting device in the display portion 2704, by displaying white characters in a black background, power consumption may be suppressed.

Further, electrical apparatuses shown above are incorporated with a light sensor in the light-emitting device which are used in the display portion, and it is possible to provide means to detect the brightness of the environment of use. When using the light-emitting device in the display portion, it is may have a function that modulates the light-emission brightness according to the brightness of the environment of use.

Specifically, this is implemented by providing an image sensor (surface shape, linear or a dotted sensor) formed by a CMOS circuit on the light-emitting device using the display portion, and providing a CCD (charge coupled device) on the main body or the casing. The user may recognize the image or the character information without trouble if a brightness of a contrast ratio of 100 to 150 may be maintained as compared to the brightness of the environment of use. Namely, in the case the environment of use is dark, it is possible to suppress the consumption power by suppressing the brightness of the image.

As in the above, the applicable range of this invention is extremely wide, and may be used for various electrical equipment. Further, the electrical apparatuses of this embodiment may use the light-emitting device and module containing any of the structures of Embodiments 1 to 7.

By implementing the present invention, the operation voltages of the EL element which emits red light, the EL element which emits green light, the EL element which emits blue light may be made the same, and a light emitting device which may perform a color display with good color balance may be provided.

Further, by using a light emitting device which may perform color display with a good color balance in the display portion, an electric appliance having a good quality display portion may be provided.

What is claimed is:

1. A display comprising:
    a display portion having a light emitting device, the light emitting device comprising a pixel portion, the pixel portion comprising:
    a first pixel including a first EL element for emitting a red light;
    a second pixel including a second EL element for emitting a green light; and
    a third pixel including a third EL element for emitting a blue light,
    wherein each of the first, second and third pixels comprises a switching thin film transistor and a current control thin film transistor; and
    wherein a triplet compound is used in the first EL element while a singlet compound is used in each of the second and third EL elements.

2. A display according to claim 1,
    wherein the switching thin film transistor is a p-channel thin film transistor and the current control thin film transistor is an n-channel thin film transistor.

3. A display according to claim 1,
    wherein the switching thin film transistor is an n-channel thin film transistor and the current control thin film transistor is an n-channel thin film transistor.

4. A display according to claim 1,
    wherein the switching thin film transistor is a p-channel thin film transistor and the current control thin film transistor is a p-channel thin film transistor.

5. A display according to claim 1, wherein the switching thin film transistor is an n-channel thin film transistor and the current control thin film transistor is a p-channel thin film transistor.

6. The display according to claim 1, wherein the triplet compound is represented by

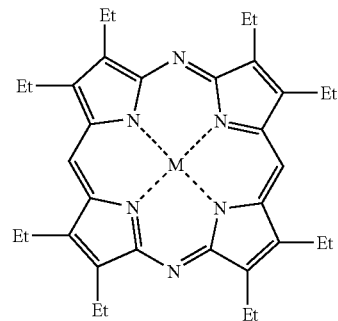

Et: ETHYL GROUP
M: ELEMENT BELONGING TO GROUP 8–10 IN THE PERIODIC TABLE.

7. The display according to claim 6, wherein the element belonging to Groups 8-10 in the periodic table is one selected from the group consisting of platinum, iridium, nickel, cobalt and palladium.

8. The display according to claim 1, wherein the triplet compound is represented by

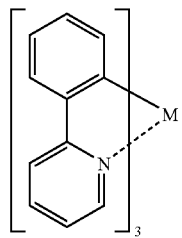

9. The display according to claim 8, wherein the element belonging to Groups 8-10 in the periodic table is one selected from the group consisting of platinum, iridium, nickel, cobalt and palladium.

10. The display according to claim 1, wherein each of the switching thin film transistor and the current control thin film transistor is a bottom gate thin film transistor.

11. The display according to claim 1, wherein each of the switching thin film transistor and the current control thin film transistor is an inverted stagger thin film transistor.

12. The display according to claim 1, wherein each of the first, second and third EL elements is operated in a range of 10V or less.

13. A portable telephone comprising:
a display portion having a light emitting element;
a sound input portion; and
a sound output portion,
the light emitting device comprising a pixel portion, the pixel portion comprising:
a first pixel including a first EL element for emitting a red light;
a second pixel including a second EL element for emitting a green light; and
a third pixel including a third EL element for emitting a blue light,
wherein each of the first, second and third pixels comprises a switching thin film transistor and a current control thin film transistor; and
wherein a triplet compound is used in the first EL element while a singlet compound is used in each of the second and third EL elements.

14. A portable telephone according to claim 13, wherein the switching thin film transistor is a p-channel thin film transistor and the current control thin film transistor is an n-channel thin film transistor.

15. A portable telephone according to claim 13, wherein the switching thin film transistor is an n-channel thin film transistor and the current control thin film transistor is an n-channel thin film transistor.

16. A portable telephone according to claim 13, wherein the switching thin film transistor is a p-channel thin film transistor and the current control thin film transistor is a p-channel thin film transistor.

17. A portable telephone according to claim 13, wherein the switching thin film transistor is an n-channel thin film transistor and the current control thin film transistor is a p-channel thin film transistor.

18. The portable telephone according to claim 13, wherein the triplet compound is represented by

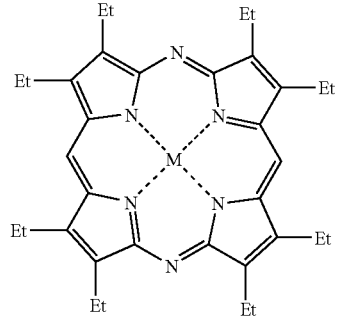

Et: ETHYL GROUP
M: ELEMENT BELONGING TO GROUP 8–10 IN THE PERIODIC TABLE.

19. The portable telephone according to claim 18, wherein the element belonging to Groups 8-10 in the periodic table is one selected from the group consisting of platinum, iridium, nickel, cobalt and palladium.

20. The portable telephone according to claim 13, wherein the triplet compound is represented by

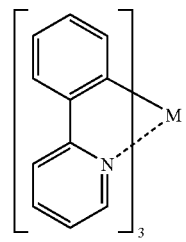

21. The portable telephone according to claim 20, wherein the element belonging to Groups 8-10 in the periodic table is one selected from the group consisting of platinum, iridium, nickel, cobalt and palladium.

22. The portable telephone according to claim 13, wherein each of the switching thin film transistor and the current control thin film transistor is a bottom gate thin film transistor.

23. The portable telephone according to claim 13, wherein each of the switching thin film transistor and the current control thin film transistor is an inverted stagger thin film transistor.

24. The portable telephone according to claim 13, wherein each of the first, second and third EL elements is operated in a range of 10V or less.

25. A display comprising:
a display portion having a light emitting device, the light emitting device comprising a pixel portion, the pixel portion comprising:
a first pixel including a first EL element for emitting a red light;
a second pixel including a second EL element for emitting a green light; and
a third pixel including a third EL element for emitting a blue light,
wherein each of the first, second and third pixels comprises a switching thin film transistor and a current control thin film transistor;
wherein the first EL element comprises a triplet compound; and
wherein at least one of the second EL element and the third EL element comprises a singlet compound.

26. A display according to claim 25, wherein the switching thin film transistor is a p-channel thin film transistor and the current control thin film transistor is an n-channel thin film transistor.

27. A display according to claim 25, wherein the switching thin film transistor is an n-channel thin film transistor and the current control thin film transistor is an n-channel thin film transistor.

28. A display according to claim 25, wherein the switching thin film transistor is a p-channel thin film transistor and the current control thin film transistor is a p-channel thin film transistor.

29. A display according to claim 25, wherein the switching thin film transistor is an n-channel thin film transistor and the current control thin film transistor is a p-channel thin film transistor.

30. The display according to claim 25, wherein the triplet compound is represented by

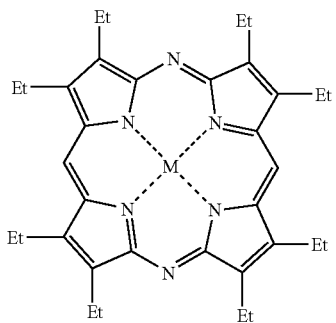

Et: ETHYL GROUP
M: ELEMENT BELONGING TO GROUP 8–10 IN THE PERIODIC TABLE.

31. The display according to claim 30, wherein the element belonging to Groups 8-10 in the periodic table is one selected from the group consisting of platinum, iridium, nickel, cobalt and palladium.

32. The display according to claim 25, wherein the triplet compound is represented by

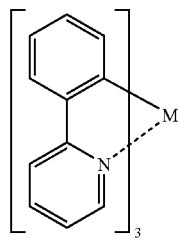

33. The display according to claim 32, wherein the element belonging to Groups 8-10 in the periodic table is one selected from the group consisting of platinum, iridium, nickel, cobalt and palladium.

34. The display according to claim 25, wherein each of the switching thin film transistor and the current control thin film transistor is a bottom gate thin film transistor.

35. The display according to claim 25, wherein each of the switching thin film transistor and the current control thin film transistor is an inverted stagger thin film transistor.

36. The display according to claim 25, wherein each of the first, second and third EL elements is operated in a range of 10V or less.

37. A portable telephone comprising:

a display portion having a light emitting element;

a sound input portion; and a sound output portion, the light emitting device comprising a pixel portion, the pixel portion comprising:

a first pixel including a first EL element for emitting a red light;

a second pixel including a second EL element for emitting a green light; and a third pixel including a third EL element for emitting a blue light, wherein each of the first, second and third pixels comprises a switching thin film transistor and a current control thin film transistor;

wherein the first EL element comprises a triplet compound; and wherein at least one of the second EL element and the third EL element comprises a singlet compound.

38. A portable telephone according to claim 37, wherein the switching thin film transistor is a p-channel thin film transistor and the current control thin film transistor is an n-channel thin film transistor.

39. A portable telephone according to claim 37, wherein the switching thin film transistor is an n-channel thin film transistor and the current control thin film transistor is an n-channel thin film transistor.

40. A portable telephone according to claim 37, wherein the switching thin film transistor is a p-channel thin film transistor and the current control thin film transistor is a p-channel thin film transistor.

41. A portable telephone according to claim 37, wherein the switching thin film transistor is an n-channel thin film transistor and the current control thin film transistor is a p-channel thin film transistor.

42. The portable telephone according to claim 37, wherein the triplet compound is represented by

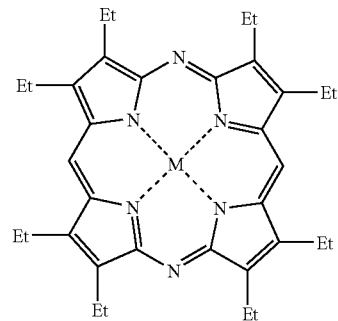

Et: ETHYL GROUP
M: ELEMENT BELONGING TO GROUP 8–10 IN THE PERIODIC TABLE.

43. The portable telephone according to claim 42, wherein the element belonging to Groups 8-10 in the periodic table is one selected from the group consisting of platinum, iridium, nickel, cobalt and palladium.

44. The portable telephone according to claim 37, wherein the triplet compound is represented by

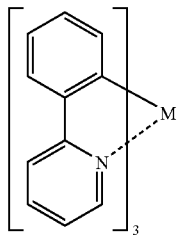

45. The portable telephone according to claim 44, wherein the element belonging to Groups 8-10 in the periodic table is one selected from the group consisting of platinum, iridium, nickel, cobalt and palladium.

46. The portable telephone according to claim 37, wherein each of the switching thin film transistor and the current control thin film transistor is a bottom gate thin film transistor.

47. The portable telephone according to claim 37, wherein each of the switching thin film transistor and the current control thin film transistor is an inverted stagger thin film transistor.

48. The portable telephone according to claim 37, wherein each of the first, second and third EL elements is operated in a range of 10V or less.

49. A portable telephone comprising:
a display portion having a light emitting element;
a sound input portion; and
a sound output portion,
the light emitting device comprising a pixel portion, the pixel portion comprising:
a first EL element for emitting a red light;
a second EL element for emitting a green light; and
a third EL element for emitting a blue light,
wherein the first EL element comprises a triplet compound; and
wherein at least one of the second EL element and the third EL element comprises a singlet compound.

50. The portable telephone according to claim 49, wherein the triplet compound is represented by

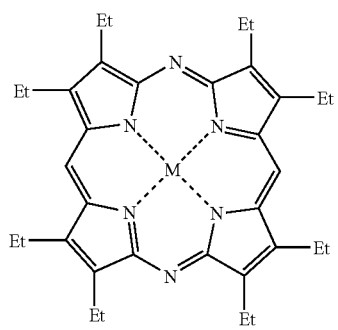

Et: ETHYL GROUP
M: ELEMENT BELONGING TO GROUP 8–10 IN THE PERIODIC TABLE.

51. The portable telephone according to claim 50, wherein the element belonging to Groups 8-10 in the periodic table is one selected from the group consisting of platinum, iridium, nickel, cobalt and palladium.

52. The portable telephone according to claim 49, wherein the triplet compound is represented by

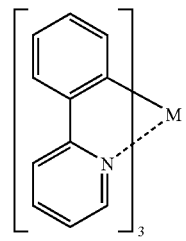

53. The portable telephone according to claim 52, wherein the element belonging to Groups 8-10 in the periodic table is one selected from the group consisting of platinum, iridium, nickel, cobalt and palladium.

54. The portable telephone according to claim 49, wherein each of the first, second and third EL elements is operated in a range of 10V or less.

55. A portable telephone comprising:
a display portion having a light emitting element;
a sound input portion; and
a sound output portion,
the light emitting device comprising a pixel portion, the pixel portion comprising:
a first EL element for emitting a red light;
a second EL element for emitting a green light; and
a third EL element for emitting a blue light,
wherein the first EL element comprises a first electrode, a second electrode and a light emitting layer comprising an organic compound which emits light by a triplet excitation interposed therebetween; and
wherein at least one of the second EL element and the third EL element comprises a third electrode, a fourth electrode and a light emitting layer comprising an organic compound which emits light by a singlet excitation interposed therebetween.

56. The portable telephone according to claim 55, wherein the organic compound which emits light by a triplet excitation is represented by

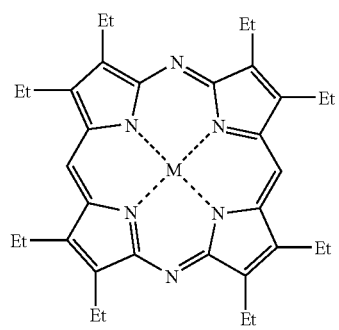

Et: ETHYL GROUP
M: ELEMENT BELONGING TO GROUP 8–10 IN THE PERIODIC TABLE.

57. The portable telephone according to claim 56, wherein the element belonging to Groups 8-10 in the periodic table is one selected from the group consisting of platinum, iridium, nickel, cobalt and palladium.

58. The portable telephone according to claim 55, wherein the organic compound which emits light by a triplet excitation is represented by

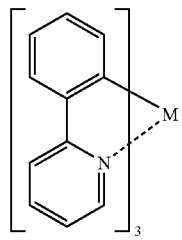

59. The portable telephone according to claim 58, wherein the element belonging to Groups 8-10 in the periodic table is one selected from the group consisting of platinum, iridium, nickel, cobalt and palladium.

60. The portable telephone according to claim 55, wherein each of the first, second and third EL elements is operated in a range of 10V or less.

61. A light emitting device having a pixel portion, the pixel portion comprising:
a first pixel electrode, a second pixel electrode, and a third pixel electrode;
a hole injection layer being in contact with each of the first pixel electrode, the second pixel electrode, and the third pixel electrode;
a first light emitting layer formed over the first pixel electrode with the hole injection layer interposed therebetween, wherein the first light emitting layer emits red light and comprises a triplet compound;
a second light emitting layer formed over the second pixel electrode with the hole injection layer interposed therebetween, wherein the second light emitting layer emits green light; and
a third light emitting layer formed over the third pixel electrode with the hole injection layer interposed therebetween, wherein the third light emitting layer emits blue light,
wherein at least one of the second light emitting layer and the third light emitting layer comprises a singlet compound.

62. The light emitting device according to claim 61, wherein the triplet compound is represented by

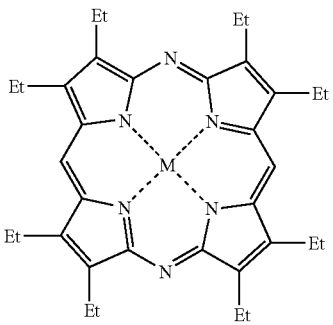

Et: ETHYL GROUP
M: ELEMENT BELONGING TO GROUP 8–10 IN THE PERIODIC TABLE.

63. The light emitting device according to claim 62, wherein the element belonging to Groups 8-10 in the periodic table is one selected from the group consisting of platinum, indium, nickel, cobalt and palladium.

64. The light emitting device according to claim 61, wherein the triplet compound is represented by

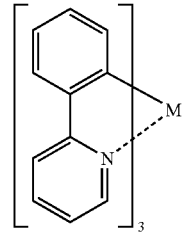

65. The light emitting device according to claim 64, wherein the element belonging to Groups 8-10 in the periodic table is one selected from the group consisting of platinum, indium, nickel, cobalt and palladium.

66. A light emitting device having a pixel portion, the pixel portion comprising:
a first thin film transistor, a second thin film transistor, and a third thin film transistor;
a first pixel electrode electrically connected to the first thin film transistor, a second pixel electrode electrically connected to the second thin film transistor, and a third pixel electrode electrically connected to the third thin film transistor;
a hole injection layer being in contact with each of the first pixel electrode, the second pixel electrode, and the third pixel electrode;
a first light emitting layer formed over the first pixel electrode with the hole injection layer interposed therebetween, wherein the first light emitting layer emits red light and comprises a triplet compound;
a second light emitting layer formed over the second pixel electrode with the hole injection layer interposed therebetween, wherein the second light emitting layer emits green light; and
a third light emitting layer formed over the third pixel electrode with the hole injection layer interposed therebetween, wherein the third light emitting layer emits blue light,
wherein at least one of the second light emitting layer and the third light emitting layer comprises a singlet compound.

67. The light emitting device according to claim 66, wherein the triplet compound is represented by

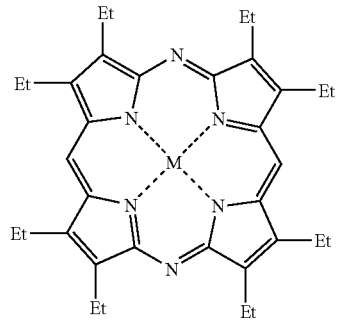

Et: ETHYL GROUP
M: ELEMENT BELONGING TO GROUP 8–10 IN THE PERIODIC TABLE.

68. The light emitting device according to claim 67, wherein the element belonging to Groups 8-10 in the periodic table is selected from the group consisting of platinum, indium, nickel, cobalt and palladium.

69. The light emitting device according to claim 66, wherein the triplet compound is represented by

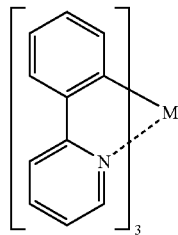

70. The light emitting device according to claim 69, wherein the element belonging to Groups 8-10 in the periodic table is one selected from the group consisting of platinum, indium, nickel, cobalt and palladium.

71. A light emitting device having a pixel portion, the pixel portion comprising:

a first thin film transistor, a second thin film transistor, and a third thin film transistor;

a first pixel electrode electrically connected to the first thin film transistor, a second pixel electrode electrically connected to the second thin film transistor, and a third pixel electrode electrically connected to the third thin film transistor;

a fourth electrode over the first pixel electrode, the second pixel electrode, and the third pixel electrode;

a first light emitting layer interposed between the first pixel electrode and the fourth electrode, wherein the first light emitting layer emits red light and comprises a triplet compound;

a second light emitting layer interposed between the second pixel electrode and the fourth electrode, wherein the second light emitting layer emits green light light; a third light emitting layer interposed between the third pixel electrode and the fourth electrode, wherein the third light emitting layer emits blue light; and an electron injecting layer interposed between the fourth electrode and each of the first light emitting layer, the second light emitting layer, and the third light emitting layer, wherein at least one of the second light emitting layer and the third light emitting layer comprises a singlet compound.

72. The light emitting device according to claim 71, wherein the triplet compound is represented by

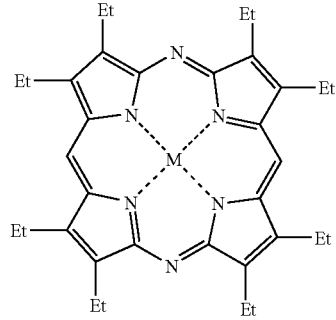

Et: ETHYL GROUP
M: ELEMENT BELONGING TO GROUP 8-10 IN THE PERIODIC TABLE.

73. The light emitting device according to claim 72, wherein the element belonging to Groups 8-10 in the periodic table is one selected from the group consisting of platinum, indium, nickel, cobalt and palladium.

74. The light emitting device according to claim 71, wherein the triplet compound is represented by

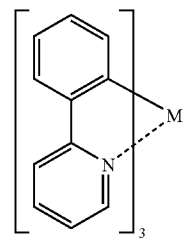

75. The light emitting device according to claim 74, wherein the element belonging to Groups 8-10 in the periodic table is one selected from the group consisting of platinum, indium, nickel, cobalt and palladium.

76. A light emitting device having a pixel portion, the pixel portion comprising:

a first thin film transistor, a second thin film transistor, and a third thin film transistor;

a first pixel electrode electrically connected to the first thin film transistor, a second pixel electrode electrically connected to the second thin film transistor, and a third pixel electrode electrically connected to the third thin film transistor;

a fourth electrode over the first pixel electrode, the second pixel electrode, and the third pixel electrode;

a hole injection layer being in contact with each of the first pixel electrode, the second pixel electrode, and the third pixel electrode;

a first light emitting layer interposed between the hole injection layer and the fourth electrode, wherein the first light emitting layer emits red light and comprises a triplet compound;

a second light emitting layer interposed between the hole injection layer and the fourth electrode, wherein the second light emitting layer emits green light light;

a third light emitting layer interposed between the hole injection layer and the fourth electrode, wherein the third light emitting layer emits blue light; and an electron injecting layer interposed between the fourth electrode and each of the first light emitting layer, the second light emitting layer, and the third light emitting layer comprises a singlet compound.

77. The light emitting device according to claim 76, wherein the triplet compound is represented by

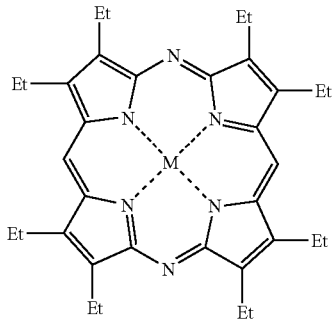

Et: ETHYL GROUP
M: ELEMENT BELONGING TO GROUP 8–10 IN THE PERIODIC TABLE.

78. The light emitting device according to claim 77, wherein the element belonging to Groups 8-10 in the poriodic table is one selected from the group consisting of platinum, indium, nickel, coablt and palladium.

79. The light emitting device according to claim 76, wherein the triplet compound is represented by

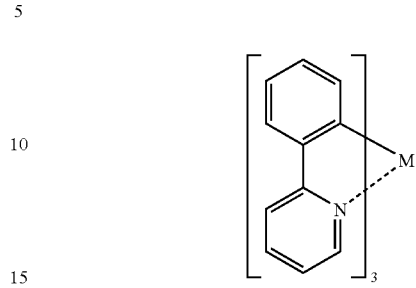

80. The light emitting device according to claim 79, wherein the element belonging to Groups 8-10 in the periodic table is one selected from the group consisting of platinum, indium, nickel, cobalt and palladium.

* * * * *